US012812866B2

(12) United States Patent
Choi

(10) Patent No.: US 12,812,866 B2
(45) Date of Patent: Nov. 24, 2026

(54) SEMICONDUCTOR MEMORY DEVICE WITH SUPPORT STRUCTURES

(71) Applicant: SK hynix Inc., Gyeonggi-do (KR)

(72) Inventor: Eun Seok Choi, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 551 days.

(21) Appl. No.: 17/978,319

(22) Filed: Nov. 1, 2022

(65) Prior Publication Data

US 2023/0380168 A1 Nov. 23, 2023

(30) Foreign Application Priority Data

May 17, 2022 (KR) ........................ 10-2022-0060409

(51) Int. Cl.
*H10B 43/35* (2023.01)
*H10B 43/27* (2023.01)
*H10B 43/40* (2023.01)

(52) U.S. Cl.
CPC ............. *H10B 43/35* (2023.02); *H10B 43/27* (2023.02); *H10B 43/40* (2023.02)

(58) Field of Classification Search
CPC ............ H01L 27/1027; H01L 27/1028; H10B 53/00; H10B 53/10; H10B 53/20; H10B 53/30; H10B 53/40; H10B 53/50; H10B 41/00; H10B 41/10; H10B 41/20; H10B 41/23; H10B 41/27; H10B 41/30; H10B 41/35; H10B 41/40–44; H10B 41/46–50; H10B 41/60; H10B 41/70; H10B 43/00; H10B 43/10; H10B 43/20; H10B 43/23;
(Continued)

(56) References Cited

U.S. PATENT DOCUMENTS 9,576,967 B1 2/2017 Kimura et al.
9,881,929 B1 * 1/2018 Ravikirthi .............. H10B 43/27
(Continued)

FOREIGN PATENT DOCUMENTS

CN 112272868 A 1/2021
KR 10-1511764 B1 4/2015
(Continued)

OTHER PUBLICATIONS

Office Action for Korean Patent Application No. 10-2022-0060409 issued by the Korean Patent Office on Sep. 12, 2025.
(Continued)

*Primary Examiner* — William B Partridge
*Assistant Examiner* — Gustavo G Ramallo
(74) *Attorney, Agent, or Firm* — IP & T GROUP LLP

(57) ABSTRACT

The present disclosure relates to a semiconductor memory device including a semiconductor substrate including a memory cell region and contact regions, a first stacked structure on the semiconductor substrate, a second stacked structure disposed between the semiconductor substrate and the first stacked structure, a plurality of cell plugs extending in a vertical direction crossing a top surface of the semiconductor substrate and arranged in the first stacked structure and the second stacked structure in the memory cell region, and a plurality of supports extending in the vertical direction and arranged in the first stacked structure in the contact region, wherein the second stacked structure is arranged in a different level from the plurality of supports.

17 Claims, 22 Drawing Sheets

(58) Field of Classification Search
CPC ........ H10B 43/27; H10B 43/30; H10B 43/35; H10B 43/40; H10B 43/50; H10B 51/00; H10B 51/10; H10B 51/20; H10B 51/30; H10B 51/40; H10B 51/50
See application file for complete search history.

(56) References Cited

U.S. PATENT DOCUMENTS

| | | | |
|---|---|---|---|
| 10,475,879 | B1 | 11/2019 | Pachamuthu et al. |
| 2016/0276358 | A1 | 9/2016 | Li |
| 2017/0287926 | A1 | 10/2017 | Ariyoshi |
| 2018/0331118 | A1* | 11/2018 | Amano ............. H01L 21/76856 |
| 2020/0286875 | A1 | 9/2020 | Nishida et al. |
| 2020/0303390 | A1* | 9/2020 | Park ..................... H10D 30/693 |
| 2021/0134821 | A1 | 5/2021 | Choi |
| 2021/0134832 | A1 | 5/2021 | Choi |
| 2021/0288068 | A1 | 9/2021 | Kim et al. |
| 2022/0037267 | A1 | 2/2022 | Zhang et al. |
| 2022/0130782 | A1 | 4/2022 | Ahn et al. |

FOREIGN PATENT DOCUMENTS

| | | | | |
|---|---|---|---|---|
| KR | 10-1589275 | B1 | 1/2016 | |
| WO | WO-2020124877 | A1 * | 6/2020 | ....... H01L 21/02532 |

OTHER PUBLICATIONS

Search Report and Written Opinion for Singaporean Application No. 10202260402S issued by the Intellectual Property Office of Singapore on Oct. 25, 2025.
Office Action for Chinese Patent Application No. 202310007212.1 issued by the Chinese Patent Office on Aug. 21, 2026.

* cited by examiner

SEMICONDUCTOR MEMORY DEVICE WITH SUPPORT STRUCTURES

CROSS-REFERENCE TO RELATED APPLICATION

The present application claims priority under 35 U.S.C. § 119(a) to Korean patent application number 10-2022-0060409 filed on May 17, 2022, in the Korean Intellectual Property Office, the entire disclosure of which is incorporated by reference herein.

BACKGROUND

1. Technical Field

Various embodiments of the present invention relate generally to a semiconductor memory device and a method of manufacturing the semiconductor memory device, and more particularly, to a three-dimensional semiconductor memory device and a method of manufacturing the three-dimensional semiconductor memory device.

2. Related Art

In general, a non-volatile memory device can electrically erase and program data and retain the data even in the absence of a power supply. Recently, the use of non-volatile memory devices has been surging in a variety of fields.

Non-volatile memory devices include memory cell transistors in various forms and are classified into NAND type and NOR type non-volatile memory devices according to their cell array structures. Both NAND and NOR type non-volatile memory devices have their own advantages and disadvantages.

More particularly, a NAND type non-volatile memory device has an advantage in that it offers high integration since it has a cell string structure in which a plurality of memory cell transistors are coupled in series with each other. In addition, a NAND type non-volatile memory device adopts an operating method by which information stored in a plurality of memory cell transistors is changed at the same time. Therefore, an information update speed of the NAND type non-volatile memory device is remarkably faster than that of the NOR type non-volatile memory device. NAND type non-volatile memory devices with high integration and fast update speed as above are used mainly in portable electronic products requiring mass storage, such as digital cameras or MP3 players. Research and development is being conducted to promote and highlight the advantages of NAND type non-volatile memory devices. Accordingly, three-dimensionally structured NAND type non-volatile memory devices have been developed.

SUMMARY

Various embodiments of the present disclosure are directed to a semiconductor memory device capable of simplifying processes.

According to an embodiment, a semiconductor memory device may include a semiconductor substrate including a memory cell region and contact regions, a first stacked structure on the semiconductor substrate, a second stacked structure disposed between the semiconductor substrate and the first stacked structure, a plurality of cell plugs extending in a vertical direction crossing a top surface of the semiconductor substrate and arranged between the first stacked structure and the second stacked structure in the memory cell region, and a plurality of supports extending in the vertical direction and arranged on the first stacked structure in the contact region, wherein the second stacked structure is arranged in a different level from the plurality of supports.

According to an embodiment, a semiconductor memory device may include a semiconductor substrate including a peripheral circuit structure, a first stacked structure including a plurality of first interlayer insulating layers and a plurality of first conductive layers stacked alternately with each other in a vertical direction crossing a top surface of the semiconductor substrate, a second stacked structure arranged between the first stacked structure and the semiconductor substrate and including a plurality of second interlayer insulating layers and a plurality of second conductive layers stacked alternately with each other in the vertical direction, a cell plug arranged in the first stacked structure and the second stacked structure, a first support arranged in a the first stacked structure and having a smaller length than the cell plug in the vertical direction, and a connection structure arranged between the second stacked structure and the peripheral circuit structure.

DETAILED DESCRIPTION

Specific structural or functional descriptions of examples of embodiments in accordance with concepts which are disclosed in this specification are illustrated only to describe the examples of embodiments in accordance with the concepts and the examples of embodiments in accordance with the concepts may be carried out by various forms but the descriptions are not limited to the examples of embodiments described in this specification.

While terms such as “first” and “second” may be used to describe various components, such components must not be understood as being limited to the above terms. The above terms are used only to distinguish one component from another. For example, a first component may be referred to as a second component without departing from the scope of rights of the present disclosure, and likewise a second component may be referred to as a first component.

Figure 1:
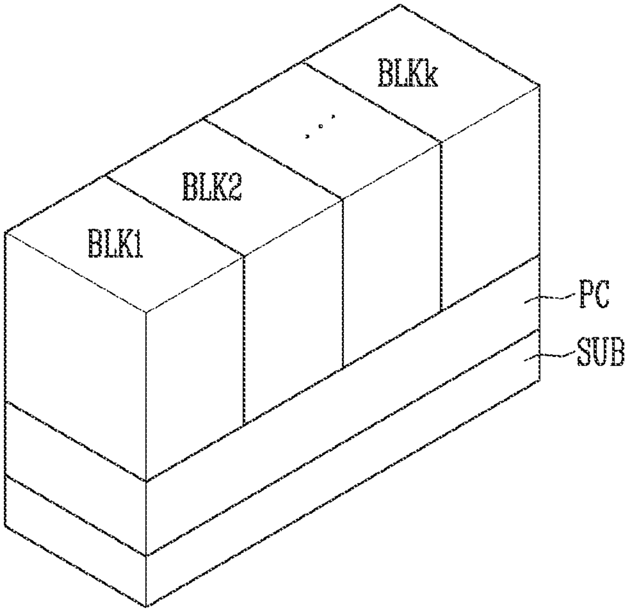
FIG. 1 is a block diagram illustrating a semiconductor memory device according to an embodiment of the present disclosure.

FIG. 1 is a block diagram illustrating a semiconductor memory device according to an embodiment of the present disclosure.

Referring to FIG. 1, a semiconductor memory device may include a peripheral circuit structure PC and memory blocks BLK1 to BLKk which are arranged on a substrate SUB. The memory blocks BLK1 to BLKk may overlap the peripheral circuit structure PC.

The substrate SUB may be a single crystal semiconductor layer. For example, the substrate SUB may be a bulk silicon substrate, a silicon-on-insulator substrate, a germanium substrate, a germanium-on-insulator substrate, a silicon-germanium substrate, or an epitaxial thin film formed by a selective epitaxial growth method.

The peripheral circuit structure PC may include a row decoder, a column decoder, a page buffer, and a control circuit which constitute a circuit for controlling operations of the memory blocks BLK1 to BLKk. For example, the peripheral circuit structure PC may include an NMOS transistor, a PMOS transistor, a resistor, and a capacitor which are electrically coupled to the memory blocks BLK1 to BLKk. The peripheral circuit structure PC may be arranged between the substrate SUB and the memory blocks BLK1 to BLKk.

Each of the memory blocks BLK1 to BLKk may include a source structure, bit lines, cell strings which are electrically coupled to the source structure and the bit lines, word lines which are electrically coupled to the cell strings, and select lines which are electrically coupled to the cell strings. Each of the cell strings may include memory cells and select transistors which are coupled in series with each other by a channel structure. Each of the select lines may serve as a gate electrode of a corresponding one of the select transistors. Each of the word lines may serve as a gate electrode of a corresponding one of the memory cells.

According to another embodiment, the substrate SUB, the peripheral circuit structure PC, and the memory blocks BLK1 to BLKk may be stacked in reverse order to the order shown in FIG. 1. As a result, the peripheral circuit structure PC may be arranged on the memory blocks BLK1 to BLKk.

Figure 2A:
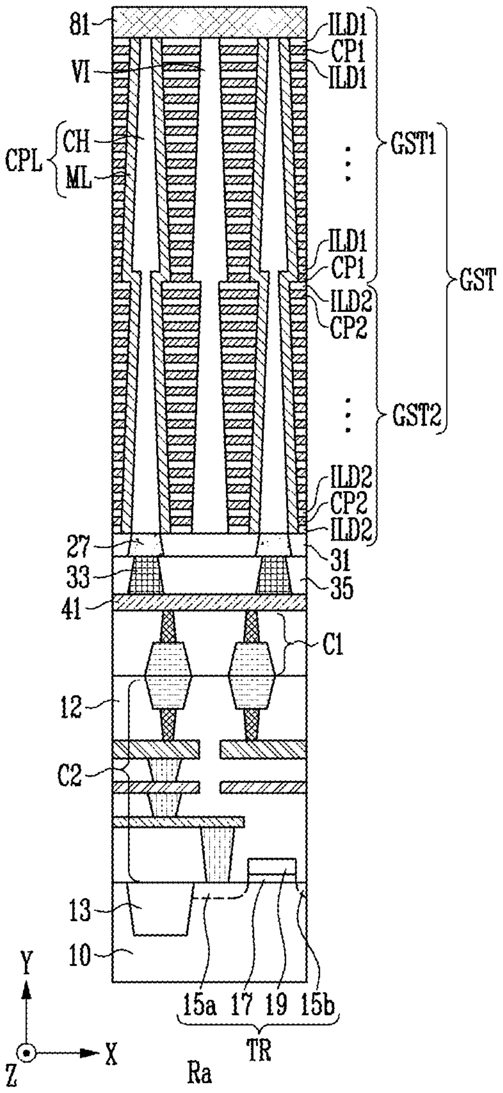
FIGS. 2A and 2B are cross-sectional views of a semiconductor memory device according to an embodiment of the present disclosure.
Figure 2B:
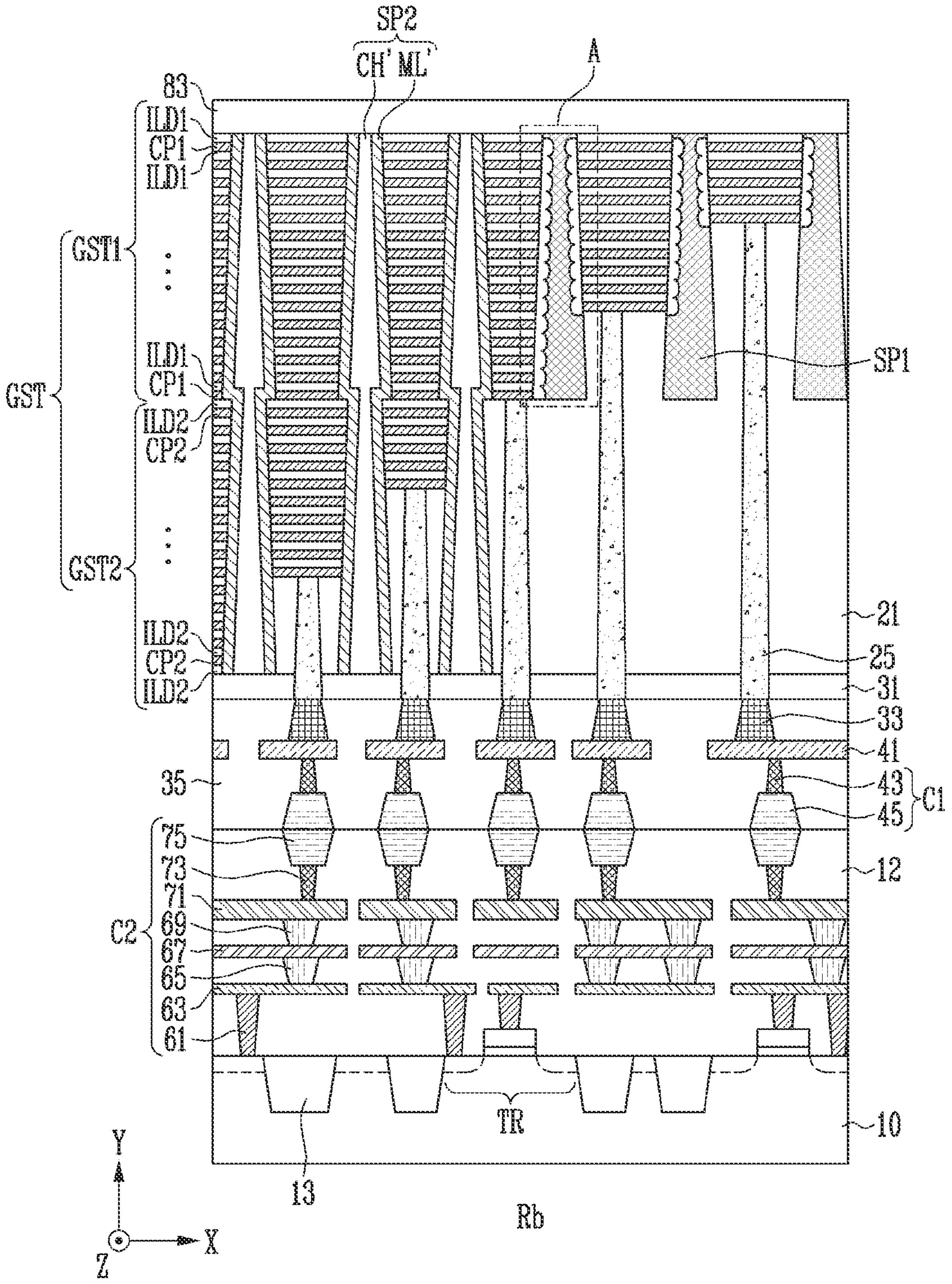

FIGS. 2A and 2B are cross-sectional diagrams illustrating a semiconductor memory device according to an embodiment of the present disclosure.

Referring to FIGS. 2A and 2B, the semiconductor memory device may include a substrate 10 which includes a memory cell region Ra and a contact region Rb, a gate stack structure GST, channel structures CH, a memory layer ML, a wiring array 41, first connection structures C1, second connection structures C2, and transistors TR of a peripheral circuit.

The substrate 10 may be configured in the same manner as described above with reference to FIG. 1. The transistors TR may form part of the peripheral circuit structure PC shown in FIG. 1. The transistors TR may be formed in an active region of the substrate 10. The active region of the substrate 10 may be divided by isolation layers 13 in the substrate 10. The transistors TR may include a gate insulating layer 17, a gate electrode 19, and junctions 15*a* and 15*b*. The junctions 15*a* and 15*b* may be formed in the active region at both sides of the gate electrode 19.

The second connection structures C2 and a second insulation layer structure 12 may be arranged on the substrate 10. Each of the second connection structures C2 may include a plurality of conductive layers 61, 63, 65, 67, 69, 71, 73, and 75. The second insulation layer structure 12 may cover the transistors TR. The second connection structures C2 may be disposed in the second insulation layer structure 12. The second insulation layer structure 12 may include one insulating layer as shown in the example of FIG. 2A. However, the invention may not be limited in this way. For example, the second insulation layer structure 12 may include one, two or more insulating layers.

The first connection structures C1 and a first insulation layer structure 35 may be arranged on the second insulation layer structure 12. Each of the first connection structures C1 may include a plurality of conductive layers 43 and 45. The first insulation layer structure 35 may cover the second insulation layer structure 12. The first connection structures C1 may be disposed in the first insulation layer structure 35. The first insulation layer structure 35 may include one insulating layer as shown in the example of FIG. 2B. However, the invention may not be limited in this way. For example, the first insulation layer structure P35 may include one, two or more insulating layers.

The plurality of conductive layers 43 and 45 which constitute the first connection structures C1 may include a first bonding metal 45. The plurality of conductive layers 61, 63, 65, 67, 69, 71, 73, and 75 which form the second connection structures C2 may include a second bonding metal 75. The first bonding metal 45 and the second bonding metal 75 may be bonded to each other.

The wiring array 41 may be disposed in the first insulation layer structure 35 and overlap the first connection structures C1. The gate stack structure GST may overlap the wiring array 41 with at least one insulating layer interposed therebetween. According to an embodiment, an upper insulating layer 31 may be arranged between the gate stack structure GST and the wiring array 41.

The gate stack structure GST may be arranged between the wiring array 41 and a source layer 81. The gate stack structure GST may include a plurality of interlayer insulating layers ILD1 and ILD2 and a plurality of conductive layers CP1 and CP2. The plurality of interlayer insulating layers ILD1 and ILD2 and the plurality of conductive layers CP1 and CP2 may be stacked alternately with each other in a vertical direction Y crossing a top surface of the substrate 10. The gate stack structure GST may include at least two stacked structures which are stacked in the vertical direction Y. According to an embodiment, the gate stack structure GST may include a first stacked structure GST1 and a second stacked structure GST2 which are stacked in the vertical direction Y. The plurality of interlayer insulating layers ILD1 and ILD2 may be divided into a plurality of first interlayer insulating layers ILD1 which form the first stacked structure GST1 and a plurality of second interlayer insulating layers ILD2 which form the second stacked structure GST2. The plurality of conductive layers CP1 and CP2 may be divided into a plurality of first conductive layers CP1 which form the first stacked structure GST1 and a plurality of second conductive layers CP2 which form the second stacked structure GST2.

Among the plurality of conductive layers CP1 and CP2, at least one conductive layer may serve as a source select line, at least one conductive layer may serve as a drain select line, and the other conductive layers between the drain select line and the source select line may serve as word lines. According to an embodiment, the second conductive layer CP2 which is adjacent to the wiring array 41 as shown in FIGS. 2A and 2B may serve as a drain select line, the first conductive layer CP1 which is adjacent to the source layer 81 may serve as a source select line, and the other conductive layers CP1 and CP2 may serve as word lines. According to another embodiment, the first conductive layer CP1 which is adjacent to the wiring array 41 as shown in FIGS. 2A and 2B, among the plurality of conductive layers CP1 and CP2, may serve as a drain select line, the second conductive layer CP2 which is adjacent to the source layer 81 may serve as a source select line, and the other conductive layers CP1 and CP2 may serve as dummy word lines and word lines. At least one of the conductive layers which are adjacent to the drain select line and the source select line may serve as a dummy word line.

The plurality of interlayer insulating layers ILD1 and ILD2 and the plurality of conductive layers CP1 and CP2 may extend in a first direction X and a second direction Z on a plane which crosses the vertical direction Y. A line which extends in the first direction X and a line which extends in the second direction Z may cross each other. According to an embodiment, the line which extends in the first direction X and the line which extends in the second direction Z may be orthogonal to each other. The plurality of interlayer insulating layers ILD1 and ILD2 and the plurality of conductive layers CP1 and CP2 may be arranged in the memory cell region Ra of the substrate 10 and may extend to the contact region Rb of the substrate 10. A portion of the gate stack structure GST in the contact region Rb may be covered by an insulating layer 83.

Referring to FIG. 2A, the channel structure CH may pass through the plurality of interlayer insulating layers ILD1 and ILD2 and the plurality of conductive layers CP1 and CP2. Each of the channel structures CH may include a sidewall which is covered by a memory layer ML corresponding thereto. The channel structure CH and the memory layer ML may form a cell plug CPL.

The channel structures CH may be coupled to the wiring array 41 through upper contacts 27. The upper contacts 27 may pass through the upper insulating layer 31. The number and shape of the upper insulating layer 31 and the upper contacts 27 between the wiring array 41 and the second stacked structure GST2 may not be limited to those shown in FIG. 2A, and may be changed. The wiring array 41 may include a bit line which is coupled to the channel structure CH.

Though not shown in FIG. 2B, each of the channel structures CH may include a channel layer surrounded by the memory layer ML, a capping pattern, and a core pillar forming a central area of the channel structure. The channel layer may serve as a channel region of a memory cell string corresponding thereto. According to an embodiment, the channel layer may include silicon. The capping pattern may include silicon or germanium, which includes a dopant for a junction, or a combination thereof. The dopant for the junction may include at least one of n type impurities and p type impurities. According to an embodiment, the capping pattern may include n type doped silicon.

A vertical insulator VI may be arranged between cell plugs CPL. The gate stack structure GST may be divided by the vertical insulator VI.

Referring to FIG. 2B, the plurality of interlayer insulating layers ILD1 and ILD2 and the plurality of conductive layers CP1 and CP2 may form a stepped structure in the contact region Rb of the substrate 10. In the contact region Rb of the substrate 10, the plurality of conductive layers CP1 and CP2 may extend to different lengths in the first direction X to thereby define the stepped structure. For example, as shown in FIG. 2B, the plurality of conductive layers CP1 and CP2 may extend to greater lengths in the first direction X the further away they are from the wiring array 41 to thereby define the stepped structure. Conductive contacts 25 may be coupled to ends of the plurality of conductive layers CP1 and CP2 which are exposed through the stepped structure.

The conductive contact 25 may extend from the end of the conductive layer corresponding thereto toward the wiring array 41. The stepped structure formed by the plurality of interlayer insulating layers ILD1 and ILD2 and the plurality of conductive layers CP1 and CP2 may be covered by a gap-filling insulating layer 21. The upper insulating layer 31 may extend to overlap the gap-filling insulating layer 21. Some of the insulating layers included in the first insulation layer structure 35 may extend between the wiring array 41 and the upper insulating layer 31. The conductive contact 25 may extend in the vertical direction Y to pass through the gap-filling insulating layer 21 and the upper insulating layer 31. The conductive contact 25 may be coupled to the wiring array 41 through a contact plug 33. The contact plug 33 may be arranged in the first insulation layer structure 35 between the wiring array 41 and the conductive contact 25. The wiring array 41 may include connecting wires which are coupled to the conductive contact 25.

Each of the plurality of conductive layers CP1 and CP2 may be connected to the transistor TR corresponding thereto through the conductive contact 25, the contact plug 33, the connecting wires of the wiring array 41, the first connection structure C1 and the second connection structure C2.

Referring to FIGS. 2A and 2B, the cell string may be defined by the gate stack structure GST, the channel structure CH, and the memory layer ML. The cell string may be included in each of the memory blocks BLK1 to BLKk as shown in FIG. 1. The channel structure CH of the cell string may be electrically coupled to the bit line of the wiring array 41 and the source layer 81.

The plurality of interlayer insulating layers ILD1 and ILD2 and the plurality of conductive layers CP1 and CP2 in the contact region Rb may be penetrated by a plurality of supports SP1 and SP2. The plurality of supports SP1 and SP2 may include a plurality of first supports SP1 and a plurality of second supports SP2.

The plurality of first supports SP1 may pass through some of the plurality of interlayer insulating layers ILD1 and ILD2 and the plurality of conductive layers CP1 and CP2 which are adjacent to the source layer 81 and the insulating layer 83, so that the plurality of first supports SP1 may have a smaller length than the cell plug CPL. According to an embodiment, the plurality of first supports SP1 may pass through the first interlayer insulating layer ILD1 and the first conductive layer CP1 of the first stacked structure GST1. The second stacked structure GST2 may be arranged between the first stacked structure GST1 and the wiring array 41 and open an end portion of the first stacked structure GST1. The plurality of first supports SP1 may pass through the end portion of the first stacked structure GST1 which is opened by the second stacked structure GST2. In other words, the second stacked structure GST2 may be provided to open an area between the plurality of first supports SP1 and the substrate 10 and may be arranged at a different level from a level of the plurality of first supports SP1.

The plurality of second supports SP2 may pass through the stacks of the gate stack structure GST. According to an embodiment, the plurality of second supports SP2 may pass through the first stacked structure GST1 and the second stacked structure GST2. At least one of the plurality of second supports SP2 may include a portion which passes through the gap-filling insulating layer 21. The second supports SP2 may have the same structure and material as the cell plug CPL. According to an embodiment, each of the second supports SP2 may include a support channel structure CH' and a support memory layer ML'. The support channel structure CH' may include the same material as the channel structure CH of the cell plug CPL. The support memory layer ML' may include the same material layers as those of the memory layer ML of the cell plug CPL and surround the support channel structure CH'. Each of the support memory layer ML' and the memory layer ML may include a tunnel isolation layer, a data storage layer, and a blocking insulating layer.

The first support SP1 may have a smaller length than the second support SP2. The first support SP1 may have a different structure from the second support SP2. Hereinafter, the first support SP1 will be described in more details with reference to FIG. 3.

Figure 3:
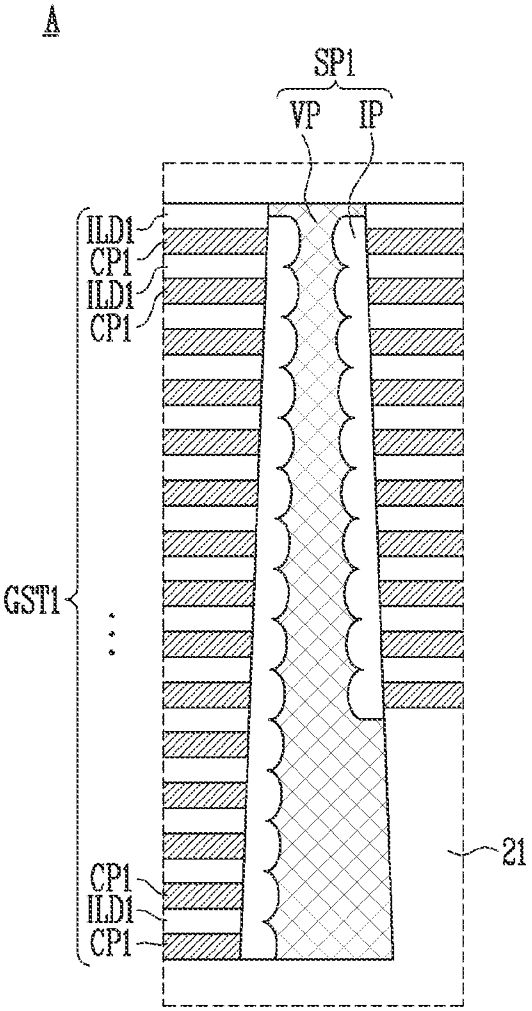
FIG. 3 is an enlarged cross-sectional diagram illustrating an area A shown in FIG. 2B.

FIG. 3 is an enlarged cross-sectional diagram illustrating an area A shown in FIG. 2B.

Referring to FIG. 3, the first support SP1 may include a portion which passes through the first stacked structure GST1 and a portion which is covered by the gap-filling insulating layer 21. The first support SP1 may include a vertical portion VP and an insulation portion IP. The vertical portion VP may extend in the vertical direction Y as described above with reference to FIG. 2B. The insulation portion IP surrounds the sidewall of the vertical portion VP. The vertical portion VP may include a material which is selected in consideration of an etch selectivity during a process of forming the gate stack structure GST. According to an embodiment, the vertical portion VP may include a semiconductor material. The insulation portion IP may include an oxide of the vertical portion VP. For example, the vertical portion VP may include polysilicon and the insulation portion IP may include a silicon oxide. The insulation portion IP may be arranged between the plurality of first conductive layers CP1 and the vertical portion VP. The insulation portion IP may have a convex shape at the same level as the plurality of first conductive layers CP1. The insulation portion IP may have a concave shape at the same level as the plurality of first interlayer insulating layers ILD1. However, the shape of the insulation portion IP may not be limited to the example shown in FIG. 3. The insulation portion IP may have various shapes. Accordingly, even when the vertical portion VP includes a conductive material, the plurality of first conductive layers CP1 of the first stacked structure GST1 may be insulated from the vertical portion VP by the insulation portion IP.

Figure 4:
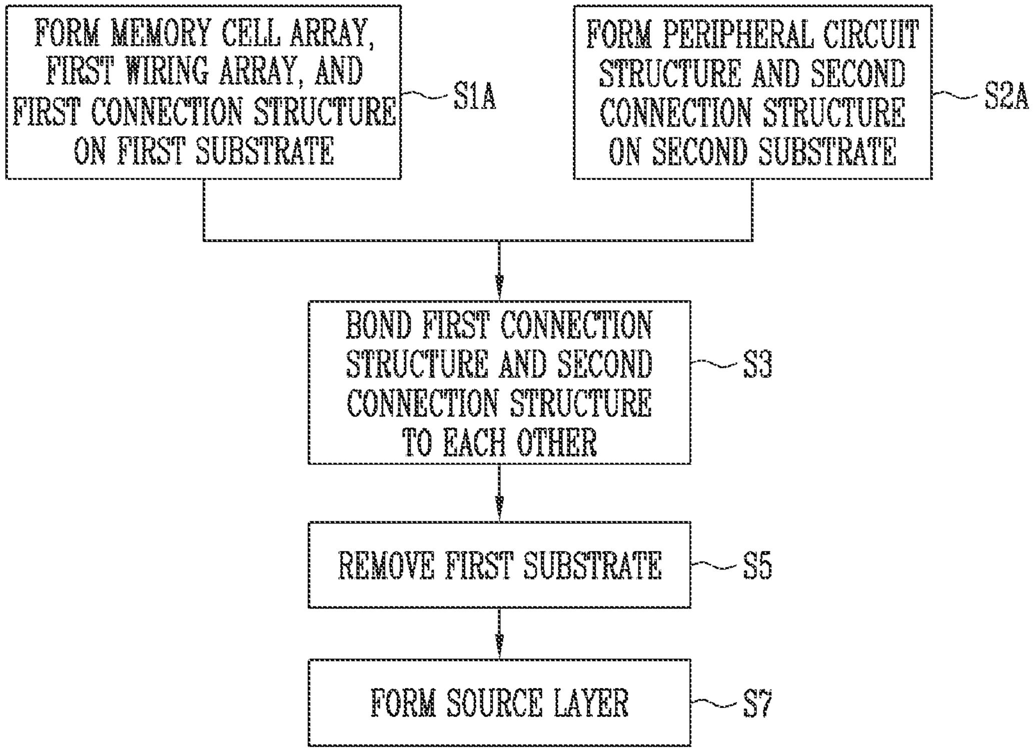
FIG. 4 is a flowchart illustrating a method of manufacturing a semiconductor memory device according to an embodiment of the present disclosure.

FIG. 4 is a flowchart illustrating a method of manufacturing a semiconductor memory device according to an embodiment of the present disclosure.

Referring to FIG. 4, a method of manufacturing a semiconductor memory device may include operation S1A forming a memory cell array, a first wiring array, and first connection structures on a first substrate, operation S2A forming a peripheral circuit structure and second connection structures on a second substrate, operation S3 bonding the first connection structures and the second connection structures to each other, operation S5 removing the first substrate and operation S7 forming a source layer.

FIGS. 5A to 5J are cross-sectional diagrams illustrating a method of manufacturing a memory block according to an embodiment of the present disclosure.

Figure 5A:
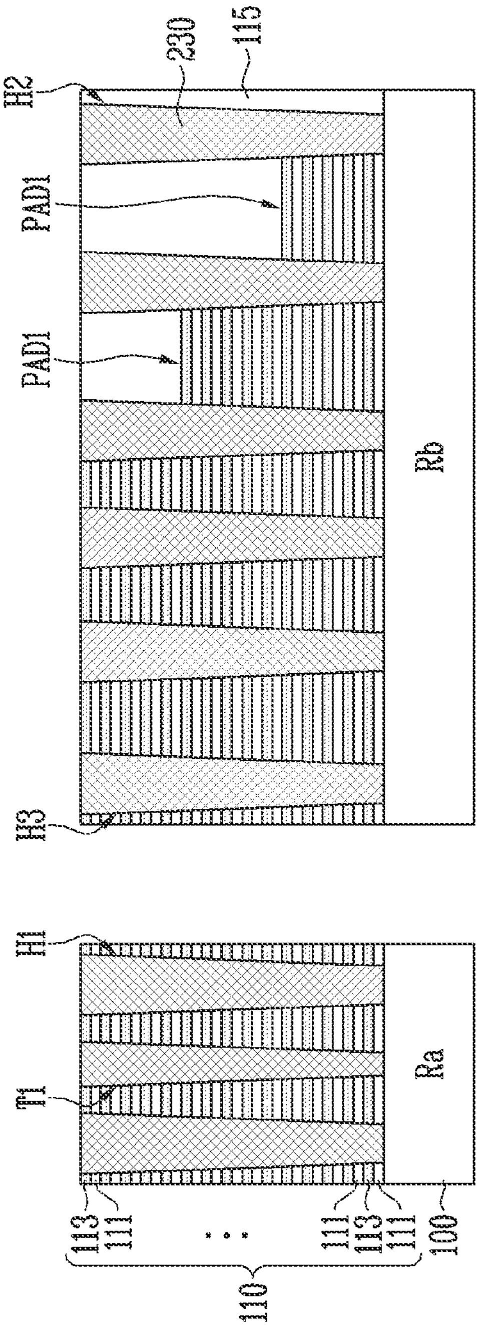
FIGS. 5A to 5J are cross-sectional diagrams illustrating a method of manufacturing a memory block according to an embodiment of the present disclosure.

Referring to FIGS. 4 and 5A, operation S1A may be carried out on a first substrate 100 including the memory cell region Ra and the contact region Rb. Operation S1A may include alternately stacking first material layers 111 and second material layers 113 with each other on the first substrate 100. The structure formed by the stacking of the first material layers 111 and the second material layers 113 alternately with each other may be referred to also as a first preliminary stacked structure 110.

The first substrate 100 may include a material with a different etch rate from the first and second material layers 111 and 113. For example, the first substrate 100 may include silicon.

The second material layers 113 may include a different material from the first material layers 111. According to an embodiment, the first material layers 111 may include an insulating material for interlayer insulating layers ILD as described above with reference to FIG. 2B. The second material layers 113 may include a material for sacrificial layers having a different etch rate from the interlayer insulating layers ILD as described above with reference to FIG. 2B. For example, the first material layers 111 may include silicon oxides, and the second material layers 113 may include silicon nitrides. FIGS. 5B to 5G illustrate an embodiment in which the first material layers 111 include an insulating material and the second material layers 113 include sacrificial layers. However, the present disclosure is not limited thereto. The physical properties of the first material layers 111 and the second material layers 113 may vary.

The first material layers 111 and the second material layers 113 may extend from the memory cell region Ra to the contact region Rb. The first material layers 111 and the second material layers 113 may extend to different lengths on the side so as to form a steppe structure in the contact region Rb. The stepped structure of the first preliminary stacked structure 110 may be referred to as a first stepped portion. An end portion of the second material layer 113 exposed by the first stepped portion may be referred to as a first pad region PAD1.

Operation S1A may include forming a first gap-filling insulating layer 115 on the first stepped portion of the first preliminary stacked structure 110. The first gap-filling insulating layer 115 may cover the first pad region PAD1 exposed through the first stepped portion.

Operation S1A may include forming a first trench T1, first holes H1, second holes H2, and third holes H3 which pass through the first gap-filling insulating layer 115 and the first preliminary stacked structure 110. The first trench T1 may pass through the first preliminary stacked structure 110 in the memory cell region Ra. The first holes H1 may pass through the first preliminary stacked structure 110 in the memory cell region Ra and be arranged at both sides of the first trench T1. The second holes H2 and the third holes H3 may pass through the first preliminary stacked structure 110 in the contact region Rb. Each of the second holes H2 may pass through the first gap-filling insulating layer 115 which overlaps the first pad region PAD1, and may pass through at least one first material layer 111 and at least one second material layer 113 under the first pad region PAD1. Each of the third holes H3 may be arranged between the first pad region PAD1 and the memory cell region Ra.

Thereafter, the first trench T1, the first holes H1, the second holes H2, and the third holes H3 may be filled with a material to form the lower supports 230, respectively. The material for the lower supports 230 may have an etch selectivity with respect to the first material layers 111 and the second material layers 113. For example, the material for the lower support 230 may include a semiconductor material. In a specific embodiment, the material for the lower support 230 may include polysilicon. However, embodiments of the present disclosure are not limited thereto.

Figure 5B:
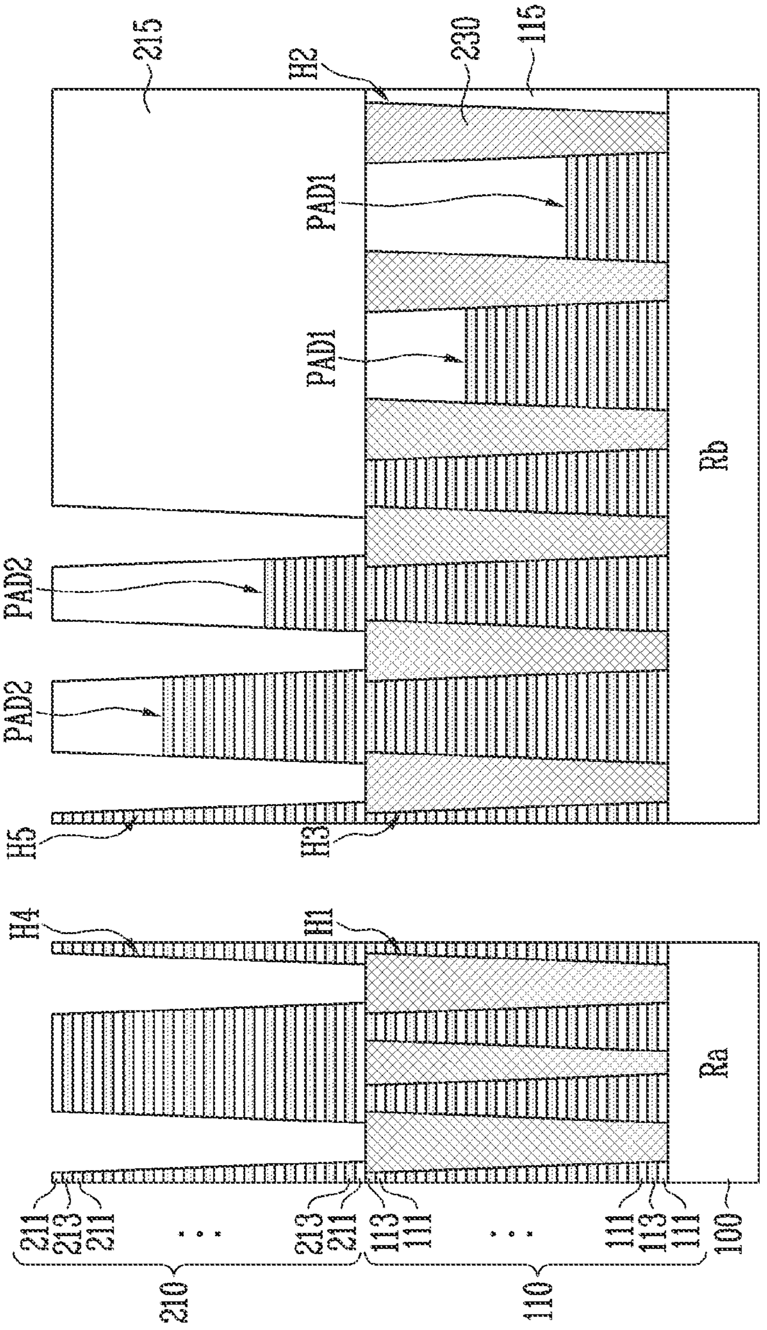

Referring to FIGS. 4 and 5B, operation S1A may include stacking third material layers 211 and fourth material layers 213 alternately with each other on the first preliminary stacked structure 110. The structure in which the third material layers 211 and the fourth material layers 213 are stacked alternately with each other may be defined as a second preliminary stacked structure 210.

The third material layers 211 of the second preliminary stacked structure 210 may include the same material as the first material layers 111. The fourth material layers 213 of the second preliminary stacked structure 210 may include the same material as the second material layers 113 of the first preliminary stacked structure 110.

The third material layers 211 and the fourth material layers 213 may extend from the memory cell region Ra to the contact region Rb. The third material layers 211 and the fourth material layers 213 may laterally extend to different lengths so as to form a stepped structure in the contact region Rb. The stepped structure of the second preliminary stacked structure 210 may be defined as a second stepped portion. The end portion of the fourth material layer 213 exposed by the second stepped portion may be defined as a second pad region PAD2. The second pad region PAD2 may overlap the lower support 230 in the third hole H3.

Operation S1A may include forming a second gap-filling insulating layer 215 on the second stepped portion of the second preliminary stacked structure 210. The second gap-filling insulating layer 215 may cover the second pad region PAD2 exposed through the second stepped portion and extend to the first gap-filling insulating layer 115.

Operation S1A may include forming fourth holes H4 and fifth holes H5 which pass through the second gap-filling insulating layer 215 and the second preliminary stacked structure 210. The fourth holes H4 may pass through the second preliminary stacked structure 210 in the memory cell region Ra and expose the lower supports 230 in the first holes H1. The fifth holes H5 may pass through the second preliminary stacked structure 210 in the contact region Rb. Each of the fifth holes H5 may pass through the second gap-filling insulating layer 215 which overlaps the second pad region PAD2 and may pass through at least one third material layer 211 and at least one fourth material layer 213 under the second pad region PAD2. The fifth holes H5 may expose the lower supports 230 in the third holes H3, respectively.

A portion of each of the fourth holes H4 and the fifth holes H5 may pass through the second preliminary stacked structure 210. Therefore, when the fourth holes H4 and the fifth holes H5 are etched, a difference in etch speed may be reduced as compared with a case in which a hole passing through the second preliminary stacked structure 210 and a hole passing through only the second gap-filling insulating layer 215 are formed at the same time. When the fourth holes H4 and the fifth holes H5 are etched, by ruling out a process of forming the hole which passes through only the second gap-filling insulating layer 215, the lower support 230 may remain in the second hole H2 with the second gap-filling insulating layer 215 covering the lower support 230.

Figure 5C:
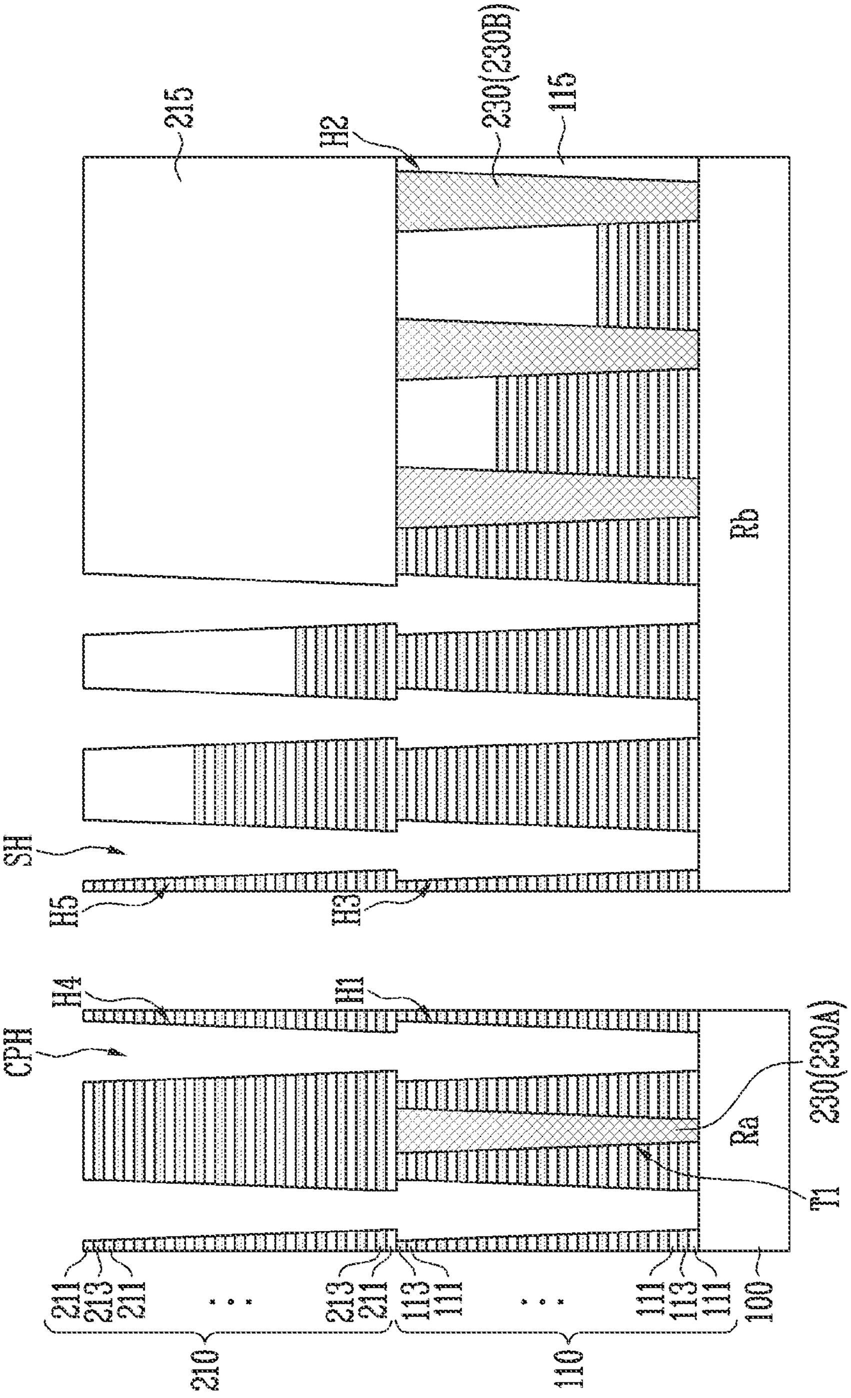

Referring to FIGS. 4 and 5C, operation S1A may include removing the lower support 230 in the first holes H1 and the third holes H3 through the fourth holes H4 and the fifth holes H5. As a result, the first holes H1 and the third holes H3 may be opened. The fourth holes H4 may be coupled to the first holes H1 to thereby define cell plug holes CPH. The fifth holes H5 may be coupled to the third holes H3 to thereby define support holes SH.

The lower support 230 in the memory cell region Ra may remain as a sacrificial pattern 230A while the lower support 230 fills the first trench T1, and may be covered by the second preliminary stacked structure 210. In addition, the lower support 230 in the contact region Rb may remain as a first support 230B while the lower support 230 fills the second hole H2, and may be covered by the second gap-filling insulating layer 215.

Figure 5D:
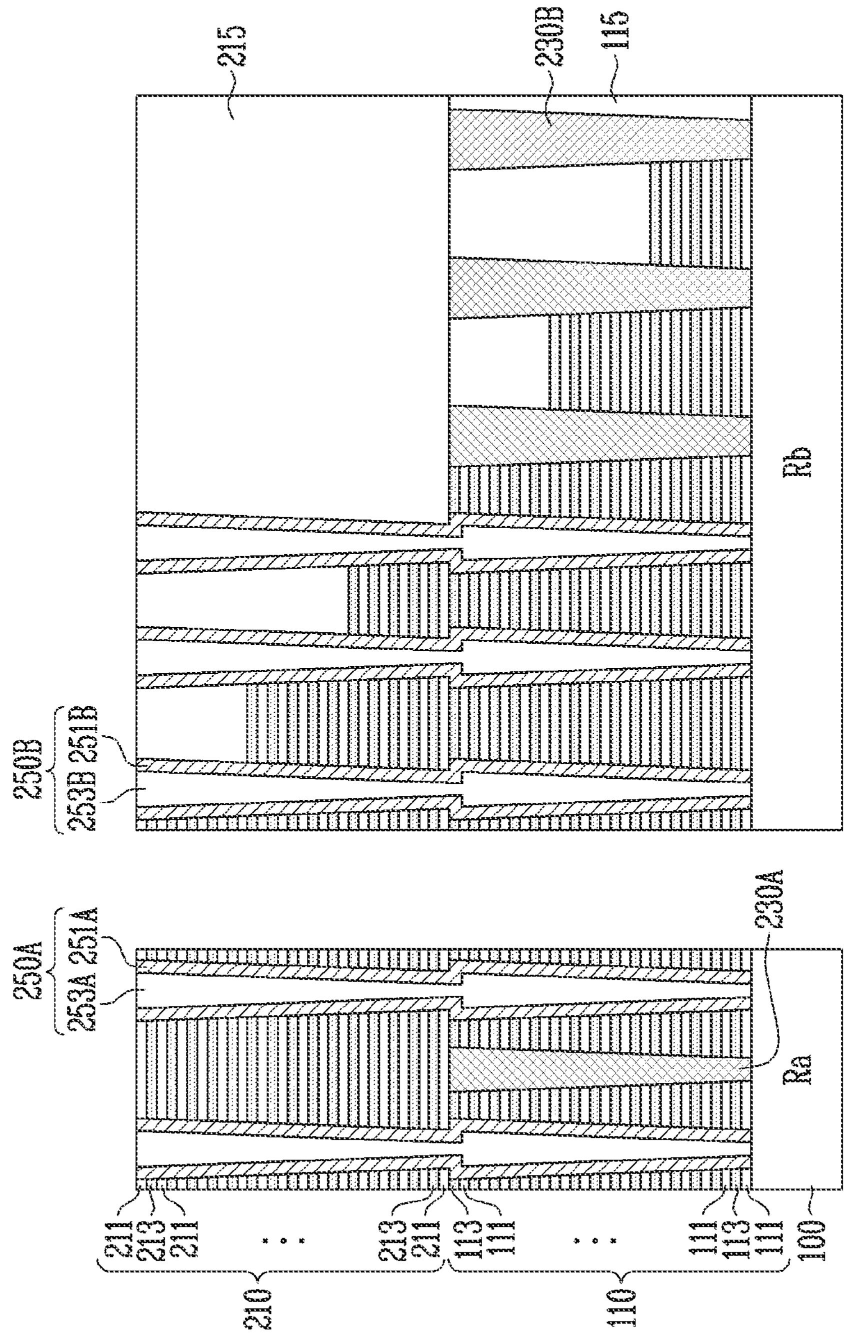

Referring to FIGS. 4 and 5D, operation S1A may include forming cell plugs 250A and second supports 250B. The cell plugs 250A may be formed in the cell plug holes CPH as shown in FIG. 5C. The second supports 250B may be formed in the support holes SH as shown in FIG. 5C. Forming the cell plugs 250A and the second supports 250B may include forming a blocking insulating layer on surfaces of the cell plug holes CPH and the support holes SH as shown in FIG. 5C, forming a data storage layer on the blocking insulating layer, forming a tunnel isolation layer on the data storage layer, and forming a channel layer on the tunnel isolation layer. The stacked structure in which the blocking insulating layer, the data storage layer, and the tunnel isolation layer are stacked on top of each other may be divided into memory layers 251A and support memory layers 251B. The channel layer may be divided into channel structures 253A and support channel structures 253B. The memory layer 251A and the channel structure 253A may form the cell plug 250A. The support memory layer 251B and the support channel structure 253B may form the second support 250B.

The second support 250B may extend in a vertical direction in which the second support 250B crosses a top surface of the first substrate 100 so as to be longer than the first support 230B. According to an embodiment, the first support 230B may have a length equal to the distance between the interface between the first gap-filling insulating layer 115 and the second gap-filling insulating layer 215 and the first substrate 100 in the vertical direction, and the second support 250B may have a greater length than the first support 230B by a height of the second preliminary stacked structure 210 in the vertical direction.

Figure 5E:
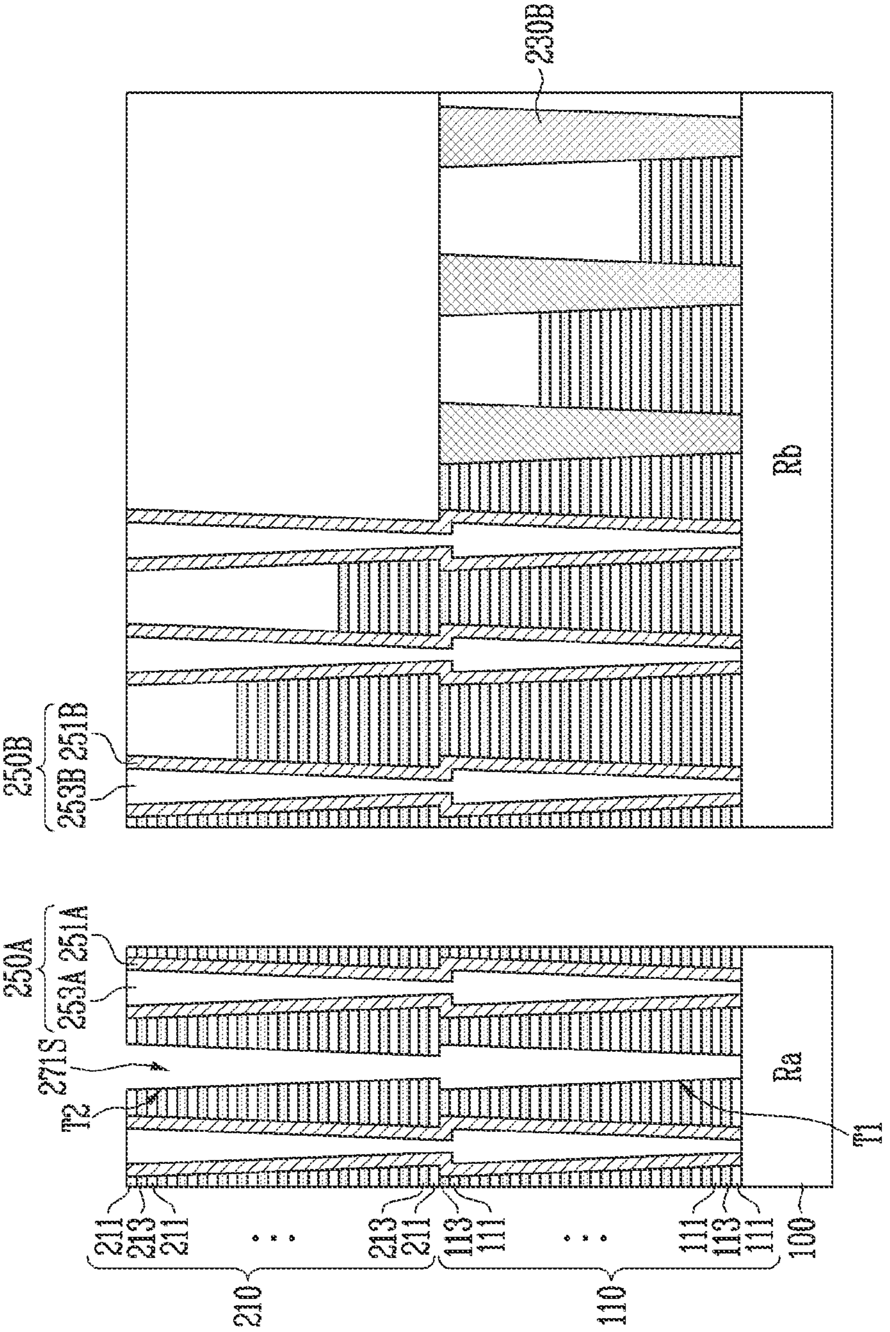

Referring to FIGS. 4 and 5E, operation S1A may include forming a slit 271S. Forming the slit 271S may include forming a second trench T2 and opening the first trench T1. The second trench T2 may pass through the second preliminary stacked structure 210 to expose the sacrificial pattern 230A as shown in FIG. 5D. The first trench T1 may be opened by removing the sacrificial pattern 230A as shown in FIG. 5D through the second trench T2. The first trench T1 and the second trench T2 may be coupled to each other to form the slit 271S.

Figure 5F:
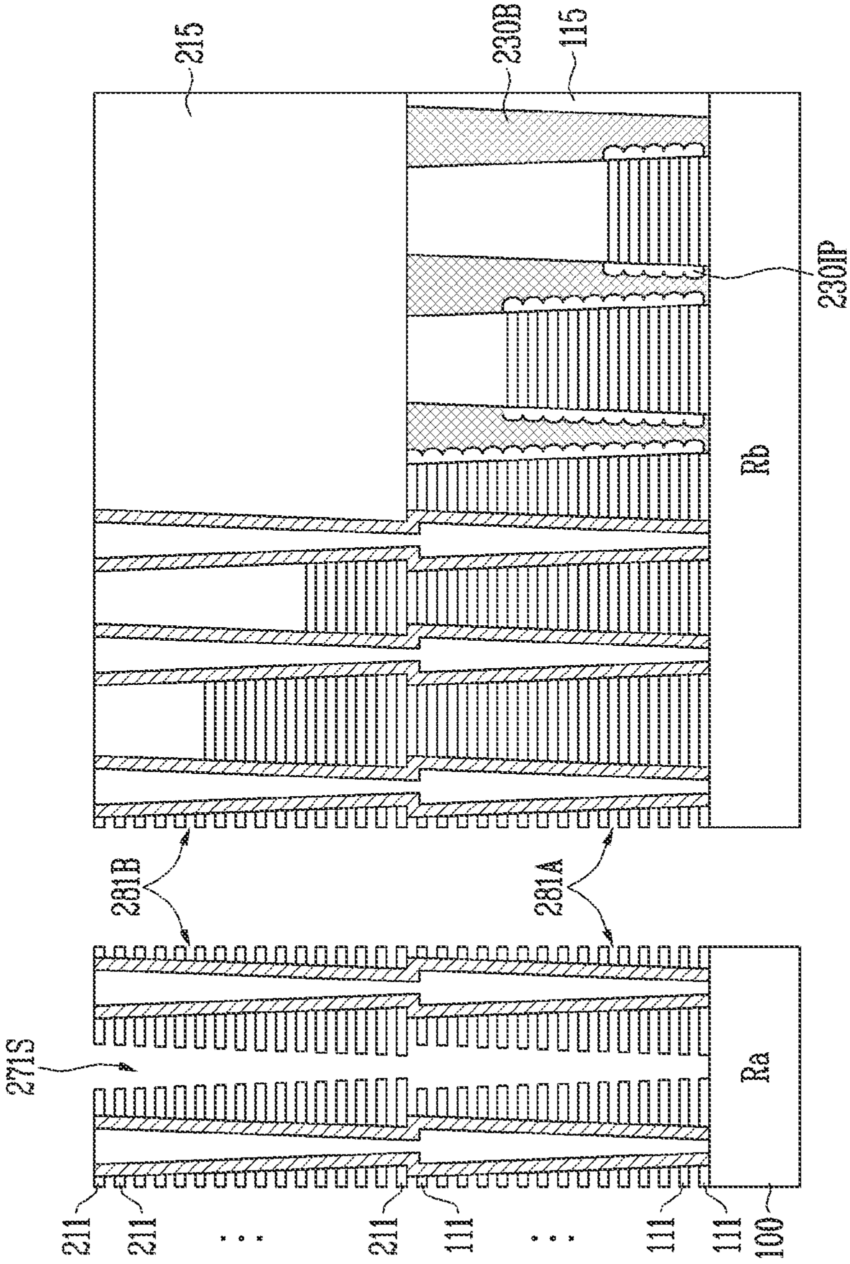

Referring to FIG. 5F, the second material layers 113 and the fourth material layers 213 as shown in FIG. 5E may be selectively removed through the slit 271S. Regions from which the second material layers 113 as shown in FIG. 5E are removed define first openings 281A. Regions from which the fourth material layers 213 as shown in FIG. 5E are removed define second openings 281B.

Portions of the first supports 230B may be exposed by the first openings 281A, respectively.

The exposed portions of the first supports 230B may be oxidized by an oxidation process. In this manner, insulation portions 230IP may be formed in the first supports 230B, respectively.

Figure 5G:
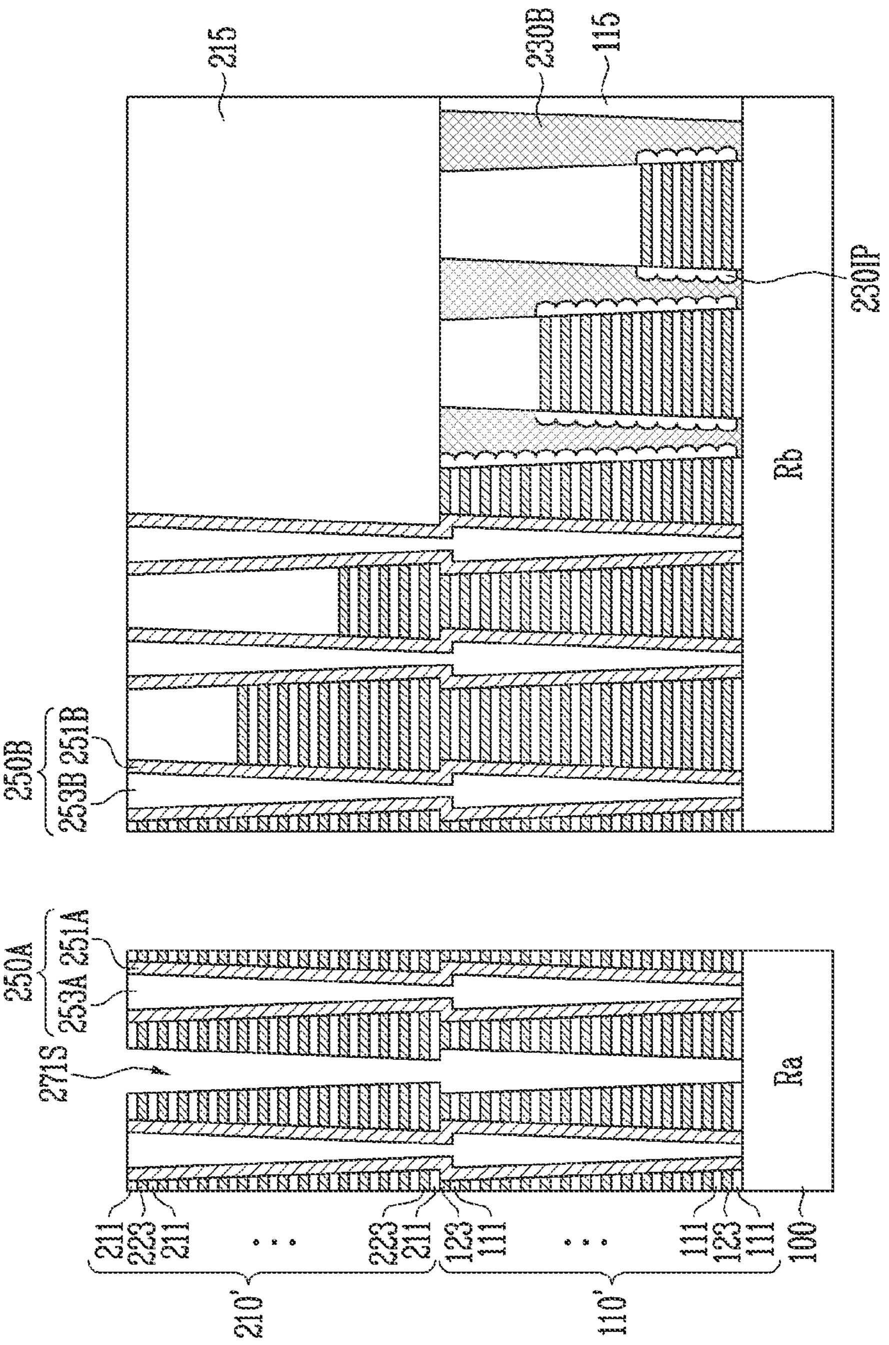

Referring to FIG. 5G, the first openings 281A and the second openings 281B as shown in FIG. 5F may be filled with conductive layers 123 and 223. In this manner, a first stacked structure 110' and a second stacked structure 210' may be formed on the first substrate 100. The conductive layers 123 and 223 may surround the cell plug 250A and the second support 250B.

According to the above-described embodiments, the cell plugs 250A and the second supports 250B may pass through the first stacked structure 110' and the second stacked structure 210'. The first supports 230B may pass through the first stacked structure 110' and be insulated from the conductive layers 123 of the first stacked structure 110' by the insulation portions 230IP.

According to another embodiment, the cell plugs 250A, the first supports 230B, and the second supports 250B may extend into the first substrate 100.

Figure 5H:
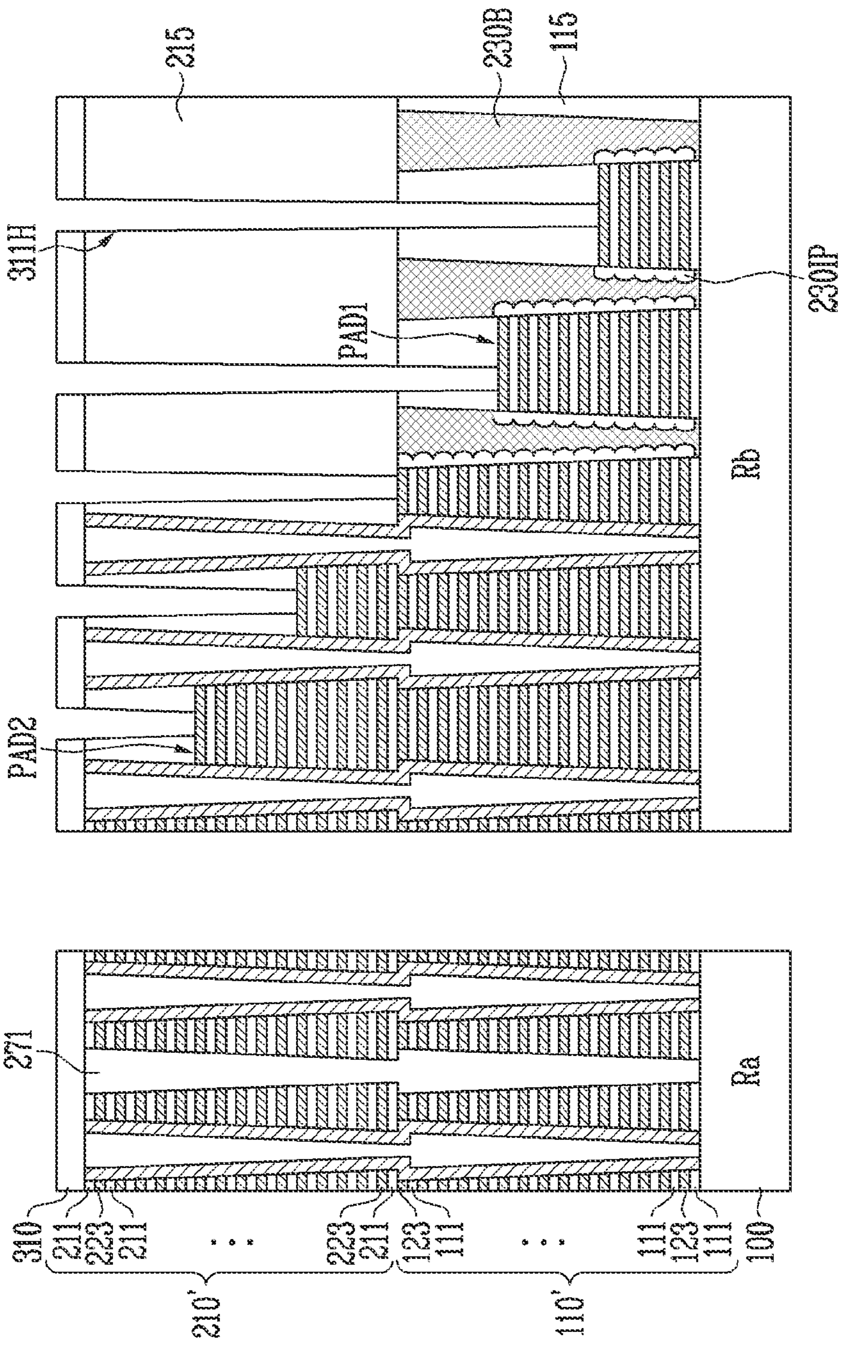

Referring to FIGS. 4 and 5H, operation S1A may include forming a slit insulating layer 271 in the slit 271S as shown in FIG. 5G and forming an upper insulating layer 310 which covers the slit insulating layer 271, the second stacked structure 210' and the second gap-filling insulating layer 215.

Contact holes 311H may be formed to expose a first pad region PAD1 and a second pad region PAD2 of the first stacked structure 110' and the second stacked structure 210' in the contact region Rb. The first pad region PAD1 may be defined as an end portion of the conductive layer 123 which is exposed through a first stepped portion of the first stacked structure 110'. The second pad region PAD2 may be defined as an end portion of the conductive layer 223 which is exposed by a second stepped portion of the second stacked structure 210'.

The contact holes 311H may pass through the upper insulating layer 310 and at least one of the first gap-filling insulating layer 115 and the second gap-filling insulating layer 215.

Figure 5I:
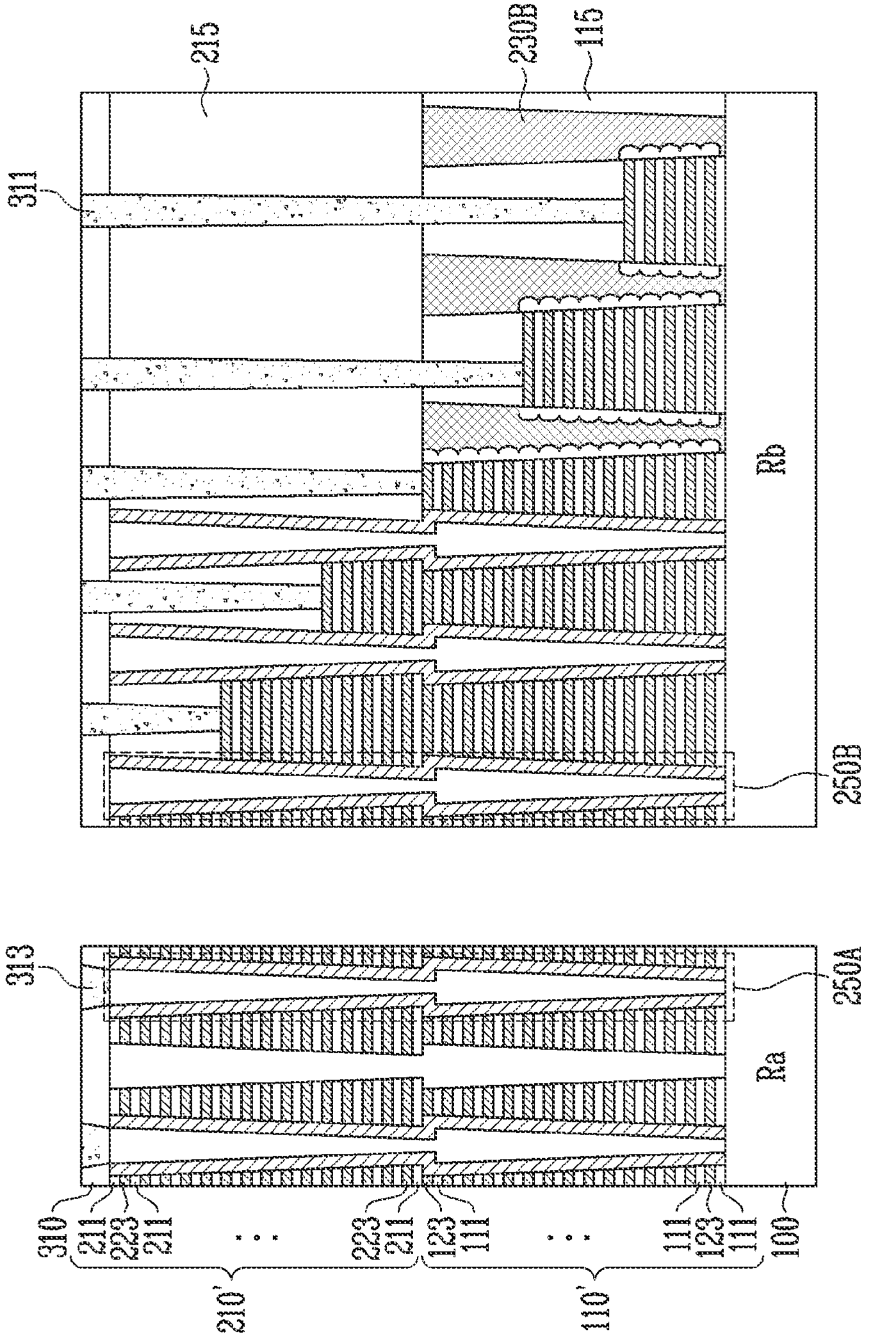

Referring to FIG. 5I, a conductive contact 311 may be formed by filling the contact hole 311H as described with reference to FIG. 5H with a conductive material.

In the memory cell region Ra, upper contacts 313 may pass through the upper insulating layer 310. The upper contacts 313 may be connected to the cell plugs 250A.

Figure 5J:
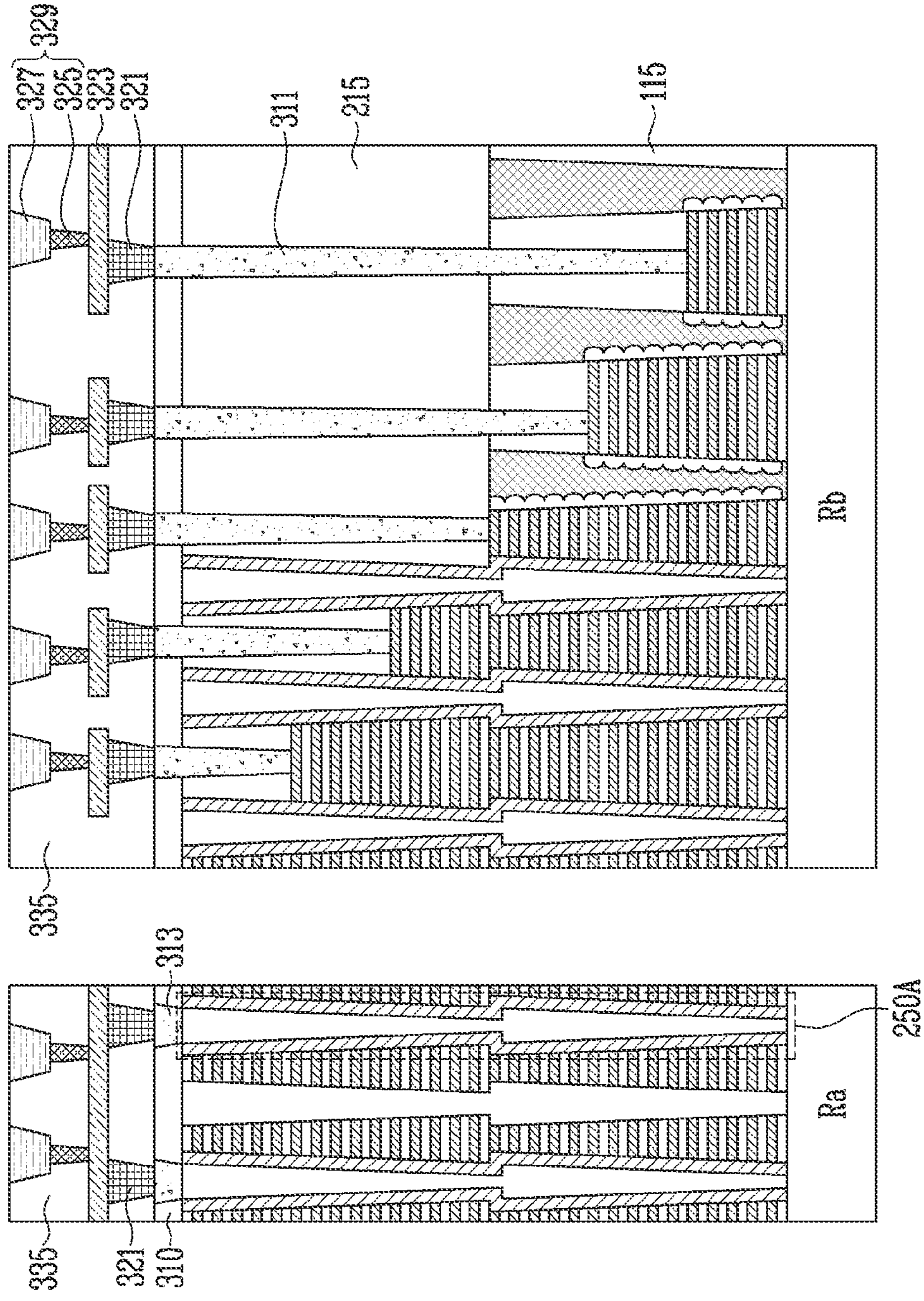

Referring to FIGS. 4 and 5J, operation S1A may include forming contact plugs 321, a wiring array 323, and first connection structures 329. The contact plugs 321, the wiring array 323, and the first connection structures 329 may be arranged in a first insulation layer structure 335. The first insulation layer structure 335 may include at least two insulating layers.

The contact plugs 321 may contact the upper contacts 313.

The wiring array 323 may include a bit line which is connected to the cell plug 250A through some of the contact plugs 321 and some of the upper contacts 313. The wiring array 323 may include a connecting wire which is connected to the conductive contact 311 through some of the contact plugs 321 and some of the upper contacts 313.

Each of the first connection structures 329 may include a plurality of conductive layers 325 and 327. The first insulation layer structure 335 and the first connection structures 329 may not be limited to the example as shown in the drawings but may vary. Some of the first connection structures 329 may be connected to the conductive contact 311. Other first connection structures 329 may be connected to the cell plug 250A of the memory cell array. The conductive layers 325 and 327 included in each of the first connection structures 329 may include a first bonding metal 327 which has a surface exposed to the outside of the first insulation layer structure 335.

Figure 6:
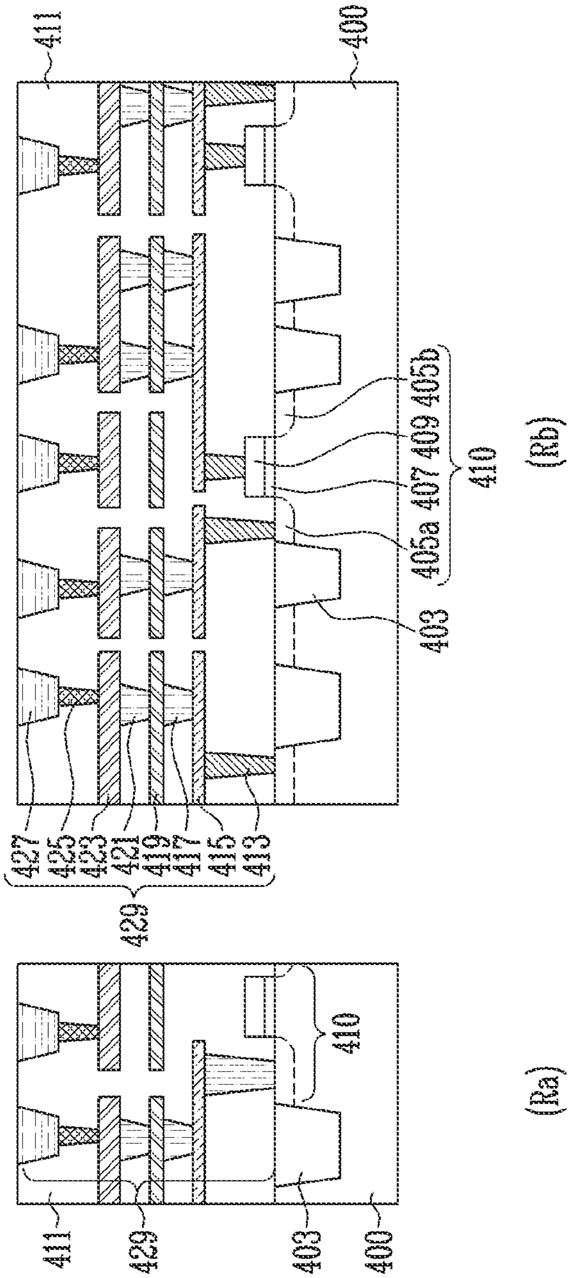
FIG. 6 is a cross-sectional view illustrating a peripheral circuit structure according to an embodiment of the present disclosure.

FIG. 6 is a cross-sectional view illustrating a peripheral circuit structure according to an embodiment of the present disclosure.

Referring to FIG. 6, at operation S2A shown in FIG. 4, a plurality of transistors 410 may be formed on a second substrate 400. The plurality of transistors 410 may be part of a peripheral circuit formed on the second substrate 400. The second substrate 400 may include the same material as the substrate SUB of FIG. 1. The second substrate 400 may include regions corresponding to the memory cell region Ra and the contact region Rb as shown in FIGS. 5A to 5J.

Each of the transistors 410 may be formed in an active region of the second substrate 400 divided by an isolation layer 403. Each of the transistors 410 may include a gate insulating layer 407 and a gate electrode 409 stacked on each other in the active region corresponding thereto, and junctions 405*a* and 405*b* formed in the active region at both sides of the gate electrode 409. The junctions 405*a* and 405*b* may include dopants for forming transistors corresponding thereto. The junctions 405*a* and 405*b* may include at least one of an n type dopant and a p type dopant.

At operation S2A as shown in FIG. 4, second connection structures 429 may be formed. The second connection structure 429 may be formed in a second insulation layer structure 411 which covers the transistors 410. The second connection structures 429 may be connected to the transistors 410.

The second insulation layer structure 411 may include two or more insulating layers. Each of the second connection structures 429 may include a plurality of conductive layers 413, 415, 417, 419, 421, 423, 425, and 427. The second insulation layer structure 411 and the second connection structures 429 may not be limited to the example as shown in FIG. 6 but may vary. The plurality of conductive layers 413, 415, 417, 419, 421, 423, 425, and 427 may include a second bonding metal 427.

Figure 7A:
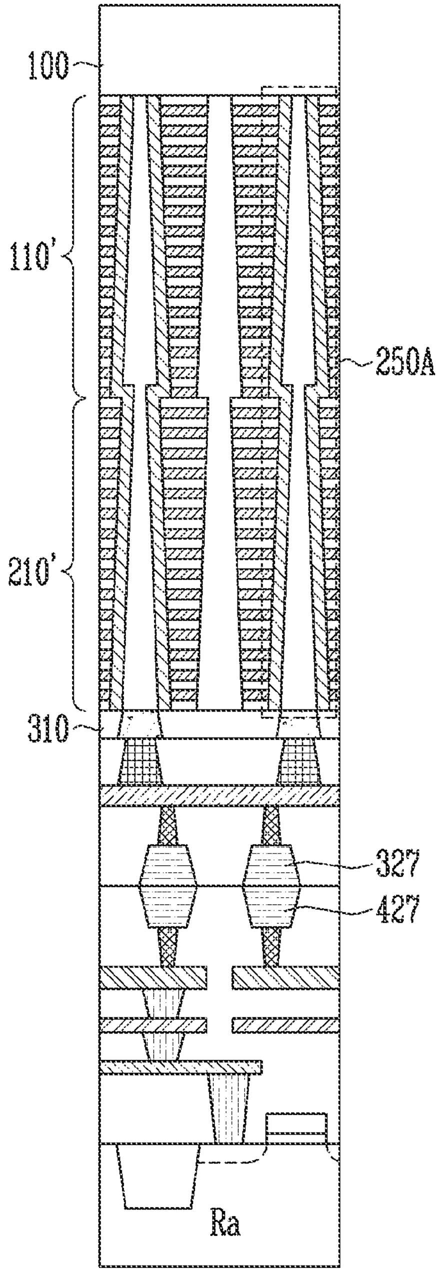
FIGS. 7A and 7B are cross-sectional diagrams illustrating an embodiment of operation S3 shown in FIG. 4.
Figure 7B:
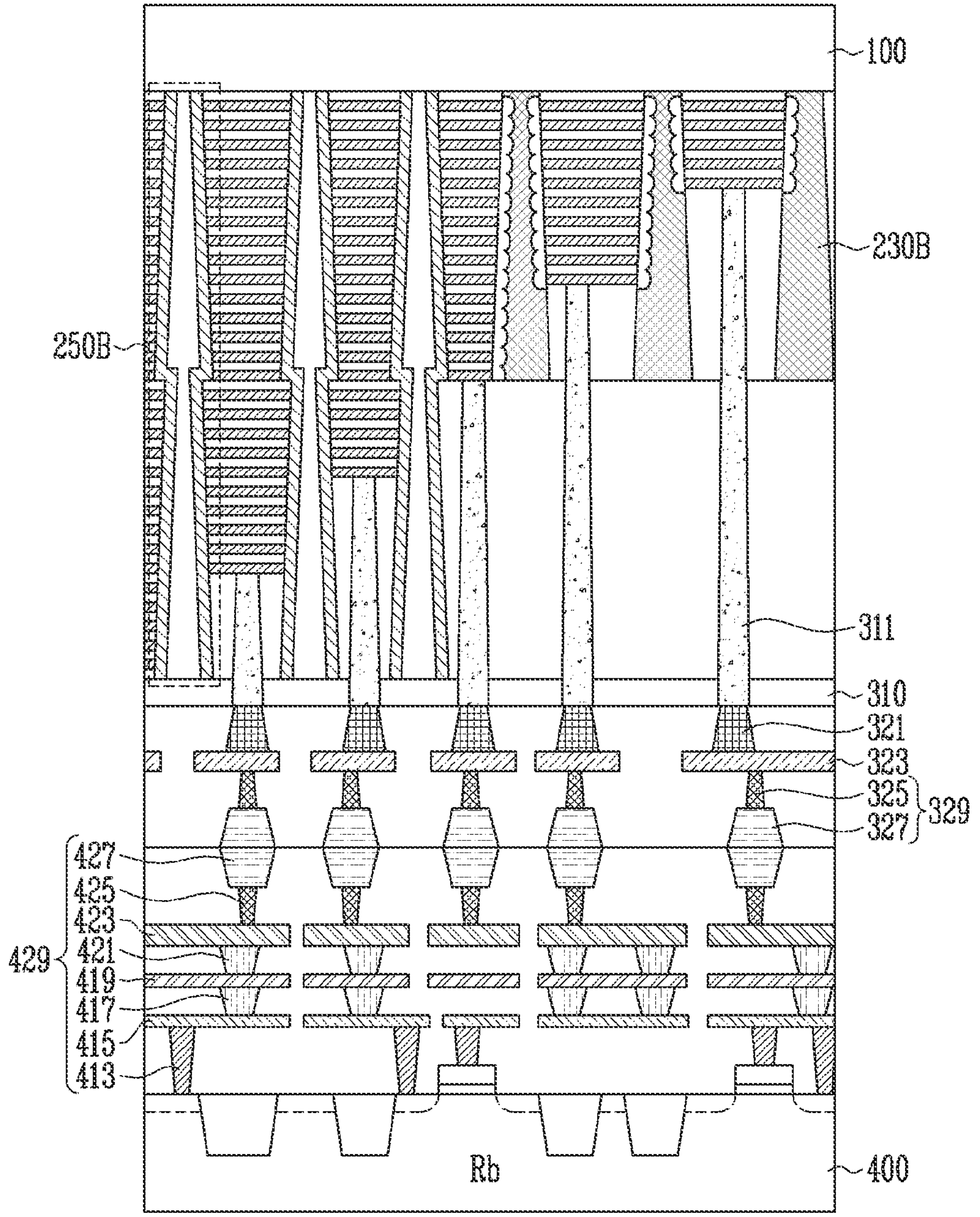

FIGS. 7A and 7B are cross-sectional diagrams illustrating an embodiment of operation S3 shown in FIG. 4.

Referring to FIGS. 7A and 7B, operation S3 may include aligning the first substrate 100 and the second substrate 400 with each other such that the first bonding metal 327 on the first substrate 100 and the second bonding metal 427 on the second substrate 400 may contact each other.

The first bonding metal 327 and the second bonding metal 427 may include various metals including copper.

Operation S3 may include bonding the first bonding metal 327 and the second bonding metal 427 to each other. For example, after heat is applied to the first bonding metal 327 and the second bonding metal 427, the first bonding metal 327 and the second bonding metal 427 may be hardened. However, the present disclosure is not limited thereto. Various processes may be performed to connect the first bonding metal 327 and the second bonding metal 427 to each other.

Figure 8A:
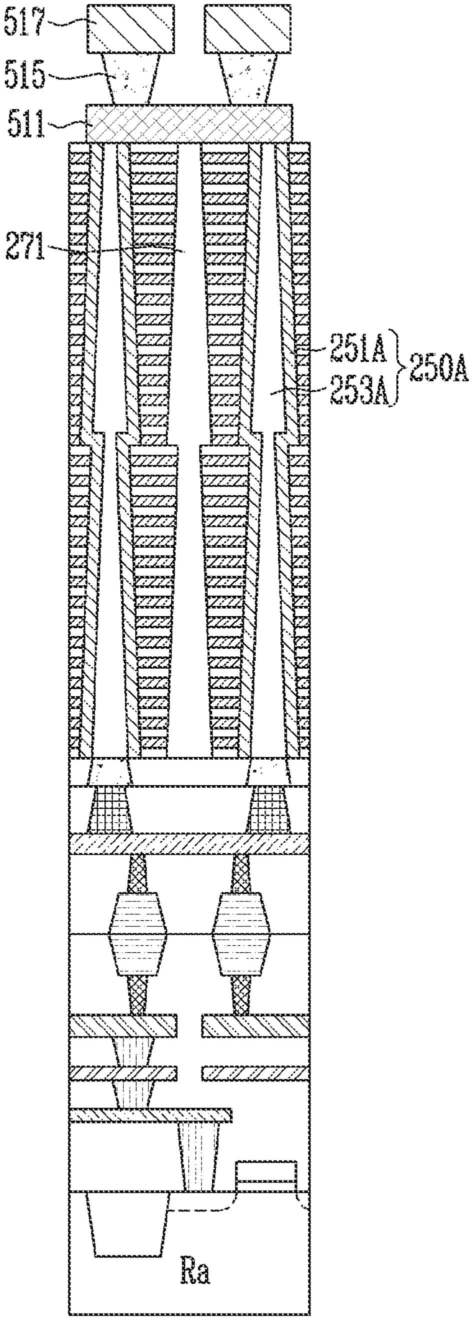
FIGS. 8A and 8B are cross-sectional diagrams illustrating an embodiment of operations S3 and S7 shown in FIG. 4.
Figure 8B:
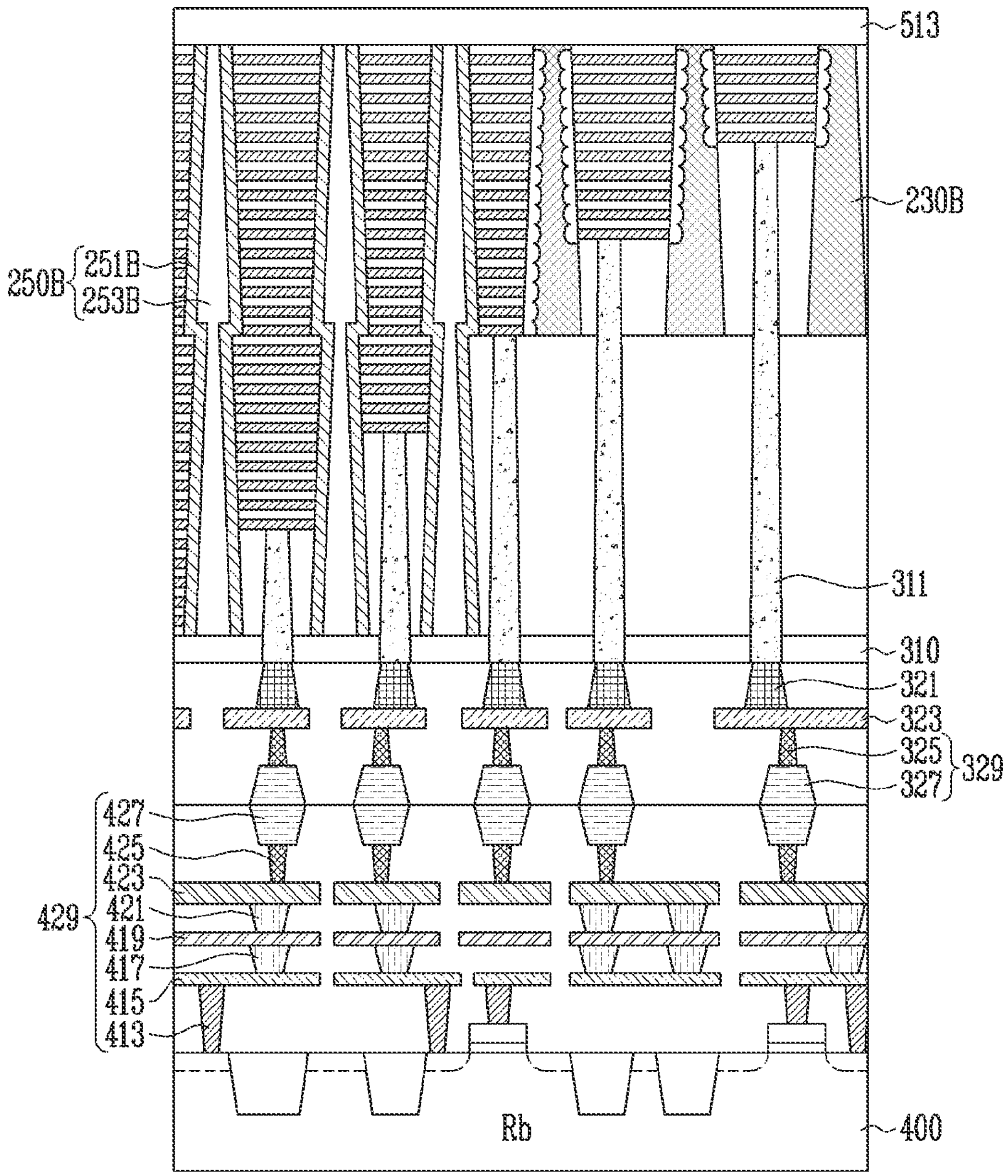

FIGS. 8A and 8B are cross-sectional diagrams illustrating an embodiment of operations S5 and S7 shown in FIG. 4.

Referring to FIGS. 8A and 8B, at operation S5, the first substrate 100 as shown in FIGS. 7A and 7B may be removed. As a result, the channel structure 253A of the cell plug 250A, the slit insulating layer 271, the first support 230B, and the second support 250B may be exposed.

Subsequently, at operation S7, a source layer 511 may be formed. The source layer 511 may contact the channel structure 253A of the cell plug 250A. The source layer 511 may be removed from the contact region Rb to expose the first support 230B and the second support 250B. The region from which the source layer 511 is removed may be filled with an insulating layer 513. The source layer 511 may include a doped semiconductor layer which includes at least one of an n type dopant and a p type dopant.

Figure 9:
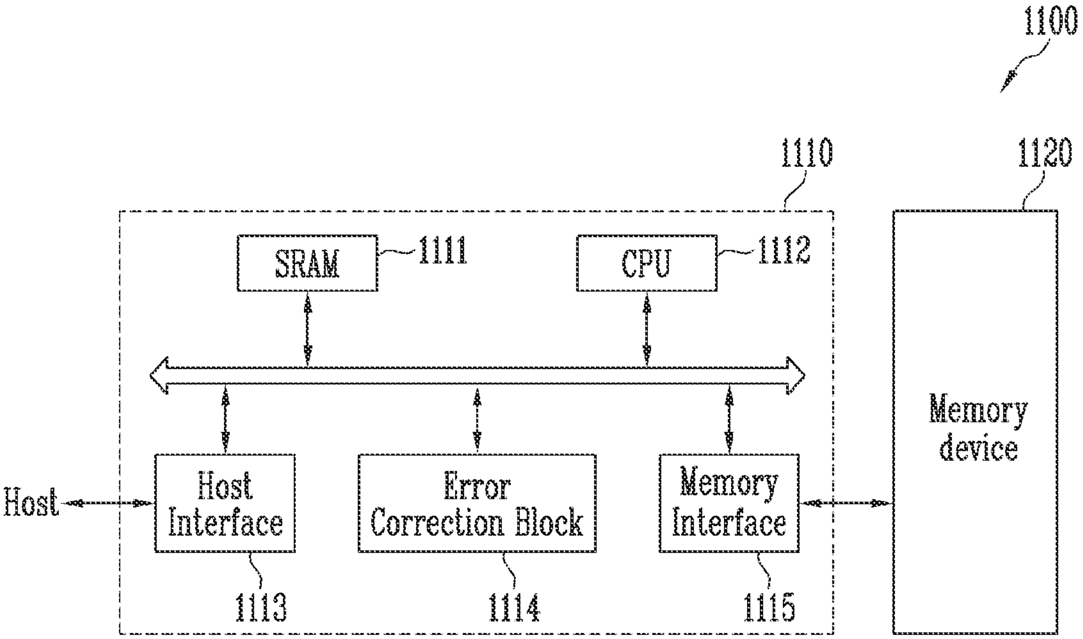
FIG. 9 is a block diagram illustrating the configuration of a memory system according to an embodiment of the present disclosure.

FIG. 9 is a block diagram illustrating a configuration of a memory system 1100 according to an embodiment of the present disclosure.

Referring to FIG. 9, the memory system 1100 includes a memory device 1120 and a memory controller 1110.

The memory device 1120 may be a multi-chip package which includes a plurality of flash memory chips.

The memory controller 1110 may be configured to control the memory device 1120, and may include static random access memory (SRAM) 1111, a central processing unit (CPU) 1112, a host interface 1113, an error correction block 1114, and a memory interface 1115. The SRAM 1111 may serve as operation memory of the CPU 1112. The CPU 1112 may perform an overall control operation for data exchange of the memory controller 1110. The host interface 1113 may include a data exchange protocol of a host connected to the memory system 1100. In addition, the error correction block 1114 may detect and correct an error included in data read from the memory device 1120. The memory interface 1115 may perform interfacing with the memory device 1120. In addition, the memory controller 1110 may further include read only memory (ROM) that stores code data for interfacing with the host.

The memory system 1100 may be a memory card or a solid state drive (SSD) into which the memory device 1120 and the memory controller 1110 are integrated. For example, when the memory system 1100 serves as the SSD, the memory controller 1110 may communicate with an external device (e.g., a host) through one of the interface protocols including Universal Serial Bus (USB), MultiMedia Card (MMC), Peripheral Component Interconnection-Express (PCI-E), Serial Advanced Technology Attachment (SATA), Parallel Advanced Technology Attachment (PATA), Small Computer System Interface (SCSI), Enhanced Small Disk Interface (ESDI), and Integrated Drive Electronics (IDE).

Figure 10:
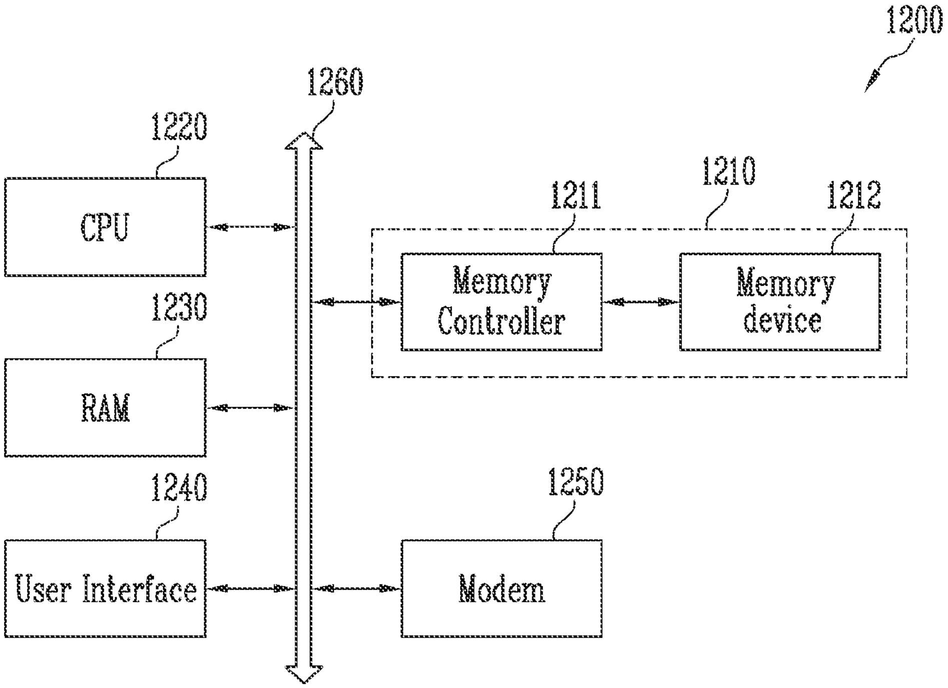
FIG. 10 is a block diagram illustrating the configuration of a computing system according to an embodiment of the present disclosure.

FIG. 10 is a block diagram illustrating a configuration of a computing system 1200 according to an embodiment of the present disclosure.

Referring to FIG. 10, the computing system 1200 may include a CPU 1220, random access memory (RAM) 1230, a user interface 1240, a modem 1250, and a memory system 1210 which are electrically connected to a system bus 1260. In addition, when the computing system 1200 is a mobile device, a battery for supplying an operating voltage to the computing system 1200 may be further included. In addition, an application chipset, an image processor, a mobile DRAM, and the like may be further included.

The memory system 1210 may include a memory device 1212 and a memory controller 1211.

The memory controller 1211 may be configured in the same manner as the memory controller 1110 as described above with reference to FIG. 9.

According to the present disclosure, processes may be simplified by forming cell plugs and supports at the same time without performing a separate process for forming the supports in a plurality of stacked structures.

What is claimed is:

1. A semiconductor memory device, comprising:

a semiconductor substrate including a memory cell region and contact regions;

a first stacked structure over the semiconductor substrate;

a second stacked structure disposed between the semiconductor substrate and the first stacked structure;

a plurality of cell plugs extending in a vertical direction crossing a top surface of the semiconductor substrate and arranged in the first stacked structure and the second stacked structure in the memory cell region; and a plurality of supports extending in the vertical direction and arranged in the first stacked structure in the contact region, wherein the second stacked structure is arranged in a different level from the plurality of supports, wherein the plurality of supports pass through the first stacked structure and each of the supports includes a vertical portion extending in the vertical direction and an insulation portion surrounding a sidewall of the vertical portion, wherein the insulation portion includes a first portion which is disposed at one side of the vertical portion and a second portion which is disposed at another side of the vertical portion, wherein a length of the first portion is longer than a length of the second portion, wherein an entire side surface of the first portion contacts the vertical portion.

2. The semiconductor memory device of claim 1, wherein the first stacked structure includes a plurality of interlayer insulating layers and a plurality of conductive layers stacked alternately with each other, and wherein the insulation portion is arranged between the plurality of conductive layers and the vertical portion.

3. The semiconductor memory device of claim 1, wherein the plurality of supports include polysilicon extending in the vertical direction and a silicon oxide surrounding a sidewall of the polysilicon.

4. The semiconductor memory device of claim 3, wherein the silicon oxide is arranged between the polysilicon and the first stacked structure.

5. The semiconductor memory device of claim 1, wherein the plurality of supports include a semiconductor material and an oxide of the semiconductor material.

6. The semiconductor memory device of claim 1, wherein the first stacked structure is formed to have a stepped structure in the contact region, and wherein the plurality of supports pass through the stepped structure of the first stacked structure.

7. A semiconductor memory device, comprising:

a semiconductor substrate including a peripheral circuit structure;

a first stacked structure including a plurality of first interlayer insulating layers and a plurality of first conductive layers stacked alternately with each other in a vertical direction crossing a top surface of the semiconductor substrate;

a second stacked structure arranged between the first stacked structure and the semiconductor substrate and including a plurality of second interlayer insulating layers and a plurality of second conductive layers stacked alternately with each other in the vertical direction;

a cell plug arranged in the first stacked structure and the second stacked structure;

a first support arranged in the first stacked structure and having a smaller length than the cell plug in the vertical direction; and a connection structure arranged between the second stacked structure and the peripheral circuit structure, wherein the first support pass through the first stacked structure and the first support includes a vertical portion extending in the vertical direction and an insulation portion surrounding a sidewall of the vertical portion, wherein the insulation portion includes a first portion which is disposed at one side of the vertical portion and a second portion which is disposed at another side of the vertical portion, wherein a length of the first portion is longer than a length of the second portion, wherein an entire side surface of the first portion contacts the vertical portion, wherein one of the first portion and the second portion includes a surface that is convex toward the vertical portion.

8. The semiconductor memory device of claim 7, wherein the first stacked structure includes a stepped structure, wherein the second stacked structure is formed to open an area between the stepped structure of the first stacked structure and the semiconductor substrate, and wherein the first support passes through the stepped structure of the first stacked structure.

9. The semiconductor memory device of claim 7, further comprising a second support passing through the first stacked structure and the second stacked structure, wherein the first support has a smaller length than the second support in the vertical direction.

10. The semiconductor memory device of claim 9, wherein the second support includes a same material as the cell plug.

11. The semiconductor memory device of claim 7, wherein the insulation portion is arranged between the vertical portion and the plurality of first conductive layers, and wherein the insulation portion includes a different material from the vertical portion.

12. A semiconductor memory device, comprising:

a semiconductor substrate including a peripheral circuit structure;

a first stacked structure including a plurality of first interlayer insulating layers and a plurality of first conductive layers stacked alternately with each other in a vertical direction crossing a top surface of the semiconductor substrate;

a second stacked structure arranged between the first stacked structure and the semiconductor substrate and including a plurality of second interlayer insulating layers and a plurality of second conductive layers stacked alternately with each other in the vertical direction;

a cell plug arranged in the first stacked structure and the second stacked structure;

a first support arranged in the first stacked structure and having a smaller length than the cell plug in the vertical direction;

a bit line coupled to the cell plug;

a first connection structure connected to the bit line; and a second connection structure connected to the peripheral circuit structure, wherein the first connection structure and second connection structure are bonded to each other, wherein the first support pass through the first stacked structure and the first support includes a vertical portion extending in the vertical direction and an insulation portion surrounding a sidewall of the vertical portion, wherein the insulation portion includes a first portion which is disposed at one side of the vertical portion and a second portion which is disposed at another side of the vertical portion, wherein a length of the first portion is longer than a length of the second portion, wherein an entire side surface of the first portion contacts the vertical portion, wherein one of the first portion and the second portion includes a surface that is convex toward the vertical portion.

13. The semiconductor memory device of claim 12, wherein the first connection structure including a first bonding pad and the second connection structure including a second bonding pad.

14. The semiconductor memory device of claim 12, wherein forming the first stacked structure and forming the second stacked structure both comprise stacking a plurality of insulating layers and a plurality of sacrificial layers alternately with each other.

15. The semiconductor memory device of claim 12, further comprising a second support passing through the first stacked structure and the second stacked structure, wherein the first support has a smaller length than the second support in the vertical direction.

16. The semiconductor memory device of claim 15, wherein the second support includes a same material as the cell plug.

17. The semiconductor memory device of claim 12, wherein the insulation portion is arranged between the vertical portion and the plurality of first conductive layers, and wherein the insulation portion includes a different material from the vertical portion.

* * * * *